US006416647B1

(12) United States Patent
Dordi et al.

(10) Patent No.: US 6,416,647 B1
(45) Date of Patent: Jul. 9, 2002

(54) ELECTRO-CHEMICAL DEPOSITION CELL FOR FACE-UP PROCESSING OF SINGLE SEMICONDUCTOR SUBSTRATES

(75) Inventors: Yezdi Dordi, Palo Alto; Joe Stevens, San Jose; Roy Edwards; Bob Lowrance, both of Los Gatos; Michael Sugarman, San Francisco; Mark Denome, San Jose, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/294,240

(22) Filed: Apr. 19, 1999

Related U.S. Application Data
(60) Provisional application No. 60/082,494, filed on Apr. 21, 1998.

(51) Int. Cl.[7] .................................................. C25D 5/04
(52) U.S. Cl. ................ 205/137; 204/275.1; 204/224 R; 204/297.01; 204/282; 204/284; 204/222; 204/212; 204/278; 204/297.03
(58) Field of Search .................................. 204/225, 212, 204/275.1, 278, 282, 284, 222, 297.03; 205/80, 143, 137

(56) References Cited

U.S. PATENT DOCUMENTS
| | | | |
|---|---|---|---|
| 3,727,620 A | 4/1973 | Orr | 134/95 |
| 3,770,598 A | 11/1973 | Creutz | 204/52 R |

(List continued on next page.)

FOREIGN PATENT DOCUMENTS
| | | | | |
|---|---|---|---|---|
| JP | 58182823 | 10/1983 | ......... | H01L/21/288 |
| JP | 63118093 | 5/1988 | ............ | C25D/5/18 |
| JP | 1255684 | 10/1989 | | |
| JP | 04131395 | 5/1992 | ............ | C25D/5/34 |
| JP | 04280993 | 10/1992 | ............ | C25D/5/18 |
| JP | 6017291 | 1/1994 | ............ | C25D/7/12 |
| WO | WO 97/12079 | 4/1997 | ............ | C25D/5/02 |

OTHER PUBLICATIONS
PCT International Search Report dated Feb. 7, 2000.
PCT Search Report Dated Feb. 18, 2000.
Kenneth E. Pitney, "NEY Contact Manual," Electrical Contacts for Low Energy Uses, 1973.
Lucio Colombo, "Wafer Back Surface Film Removal," Central R&D, SGS–Thompson, Microelectronics, Agrate, Italy, 6 pages.

(List continued on next page.)

*Primary Examiner*—Donald R. Valentine
*Assistant Examiner*—Thao Tran
(74) *Attorney, Agent, or Firm*—Thomason, Moser & Patterson, LLP

(57) ABSTRACT

The invention provides an electro-chemical deposition cell for face-up processing of semiconductor substrates comprising a substrate support member, a cathode connected to the substrate plating surface, an anode disposed above the substrate support member and an electroplating solution inlet supplying an electroplating solution fluidly connecting the anode and the substrate plating surface. Preferably, the anode comprises a consumable metal source disposed in a liquid permeable structure, and the anode and a cavity ring define a cavity for holding and distributing the electroplating solution to the substrate plating surface. Preferably, the substrate support member comprises a vacuum chuck having vacuum ports disposed on the substrate supporting surface that serves to provide suction during processing and to provide a blow-off gas flow to prevent backside contamination during substrate transfers. The substrate support member also rotates and vibrates during processing to enhance the electro-deposition onto the substrate plating surface.

25 Claims, 15 Drawing Sheets

U.S. PATENT DOCUMENTS

| | | | |
|---|---|---|---|
| 4,027,686 A | 6/1977 | Shortes et al. | 134/33 |
| 4,092,176 A | 5/1978 | Kozai et al. | 134/186 |
| 4,110,176 A | 8/1978 | Creutz et al. | 204/52 R |
| 4,113,492 A | 9/1978 | Sato et al. | 96/67 |
| 4,315,059 A | 2/1982 | Raistrick et al. | 429/112 |
| 4,336,114 A | 6/1982 | Mayer et al. | 204/52 R |
| 4,376,685 A | 3/1983 | Watson | 204/52 R |
| 4,405,416 A | 9/1983 | Raistrick et al. | 204/68 |
| 4,428,815 A | 1/1984 | Powell et al. | 204/297 W |
| 4,435,266 A | 3/1984 | Johnston | 204/276 |
| 4,489,740 A | 12/1984 | Rattan et al. | 134/140 |
| 4,510,176 A | 4/1985 | Cuthbert et al. | 427/82 |
| 4,518,678 A | 5/1985 | Allen | 430/311 |
| 4,519,846 A | 5/1985 | Aigo | 134/15 |
| 4,693,805 A | 9/1987 | Quazi | 204/192.22 |
| 4,732,785 A | 3/1988 | Brewer | 427/240 |
| 5,039,381 A | 8/1991 | Mullarkey | 204/47.5 |
| 5,055,425 A | 10/1991 | Leibovitz et al. | 437/195 |
| 5,155,336 A | 10/1992 | Gronet et al. | 219/411 |
| 5,162,260 A | 11/1992 | Leibovitz et al. | 437/195 |
| 5,222,310 A | 6/1993 | Thompson et al. | 34/202 |
| 5,224,504 A | 7/1993 | Thompson et al. | 134/155 |
| 5,230,743 A | 7/1993 | Thompson et al. | 134/32 |
| 5,252,807 A | 10/1993 | Chizinsky | 219/390 |
| 5,256,274 A | 10/1993 | Poris | 205/123 |
| 5,259,407 A | 11/1993 | Tuchida et al. | 134/151 |
| 5,290,361 A | 3/1994 | Hayashida et al. | 134/2 |
| 5,316,974 A | 5/1994 | Crank | 437/190 |
| 5,328,589 A | 7/1994 | Martin | 205/296 |
| 5,349,978 A | 9/1994 | Sago et al. | 134/153 |
| 5,368,711 A | 11/1994 | Poris | 204/193 |
| 5,377,708 A | 1/1995 | Bergman et al. | 134/105 |
| 5,429,733 A | 7/1995 | Ishida | 204/224 R |
| 5,441,629 A * | 8/1995 | Kosaki | 205/148 |
| 5,608,943 A | 3/1997 | Konishi et al. | 15/302 |
| 5,625,170 A | 4/1997 | Poris | 177/50 |
| 5,651,865 A | 7/1997 | Sellers | 204/192.13 |
| 5,705,223 A | 1/1998 | Bunkofske | 427/240 |
| 5,718,813 A | 2/1998 | Drummond et al. | 204/192.12 |
| 5,723,028 A | 3/1998 | Poris | 204/231 |
| 6,017,437 A * | 1/2000 | Ting et al. | 205/80 |
| 6,063,253 A * | 5/2000 | Shreve et al. | 205/137 |
| 6,077,412 A * | 6/2000 | Ting et al. | 205/143 |

OTHER PUBLICATIONS

Semitool®, Inc., "Metallization & Interconnect," 1998, 4 pages.

Verteq Online®, "Products Overview," 1996–1998, 5 pages.

Laurell Technologies Corporation, "Two control configurations available–see WS 400 OR WS–400Lite." Oct. 19, 1998, 6 pages.

Peter Singer, "Tantalum, Copper and Damascene: The Future of Interconnects," Semiconductor International, Jun., 1998, pp. cover. 91–92,94,96 & 98.

Peter Singer, "Wafer Processing," Semiconductor International, Jun., 1998, p. 70.

* cited by examiner

ELECTRO-CHEMICAL DEPOSITION CELL FOR FACE-UP PROCESSING OF SINGLE SEMICONDUCTOR SUBSTRATES

CROSS REFERENCE TO RELATED APPLICATION

This application claims the benefit of U.S. Provisional Application Ser. No. 60/082,494, entitled "Electro-Chemical Deposition Cell for Processing of Single Semiconductor Substrates," filed on Apr. 21, 1998.

BACKGROUND OF THE INVENTION

1. Field of the Invention

The present invention generally relates to deposition of a metal layer onto a substrate. More particularly, the present invention relates to electroplating a metal layer onto a substrate.

2. Background of the Related Art

Sub-quarter micron multi-level metallization is one of the key technologies for the next generation of ultra large scale integration (ULSI). The multilevel interconnects that lie at the heart of this technology require planarization of interconnect features formed in high aspect ratio apertures, including contacts, vias, lines and other features. Reliable formation of these interconnect features is very important to the success of ULSI and to the continued effort to increase circuit density and quality on individual substrates and die.

As circuit densities increase, the widths of vias, contacts and other features, as well as the dielectric materials between them, decrease to less than 250 nanometers, whereas the thickness of the dielectric layers remains substantially constant, with the result that the aspect ratios for the features, i.e., their height divided by width, increases. Many traditional deposition processes have difficulty filling structures where the aspect ratio exceed 4:1, and particularly where it exceeds 10:1. Therefore, there is a great amount of ongoing effort being directed at the formation of void-free, nanometer-sized features having high aspect ratios wherein the ratio of feature height to feature width can be 4:1 or higher. Additionally, as the feature widths decrease, the device current remains constant or increases, which results in an increased current density in the feature.

Elemental aluminum (Al) and its alloys have been the traditional metals used to form lines and plugs in semiconductor processing because of aluminum's perceived low electrical resistivity, its superior adhesion to silicon dioxide ($SiO_2$), its ease of patterning, and the ability to obtain it in a highly pure form. However, aluminum has a higher electrical resistivity than other more conductive metals such as copper, and aluminum also can suffer from electromigration phenomena. Electromigration is believed to be the motion of ions of a metal conductor in response to the passage of high current through it, and it is a phenomenon that occurs in a metal circuit while the circuit is in operation, as opposed to a failure occurring during fabrication. Electromigration can lead to the formation of voids in the conductor. A void may accumulate and/or grow to a size where the immediate cross-section of the conductor is insufficient to support the quantity of current passing through the conductor, leading to an open circuit. The area of conductor available to conduct heat therealong likewise decreases where the void forms, increasing the risk of conductor failure. This problem is sometimes overcome by doping aluminum with copper and with tight texture or crystaline structure control of the material. However, electromigration in aluminum becomes increasingly problematic as the current density increases.

Copper and its alloys have lower resistivities than aluminum and significantly higher electromigration resistance as compared to aluminum. These characteristics are important for supporting the higher current densities experienced at high levels of integration and increase device speed. Copper also has good thermal conductivity and is available in a highly pure state. Therefore, copper is becoming a choice metal for filling sub-quarter micron, high aspect ratio interconnect features on semiconductor substrates.

Despite the desirability of using copper for semiconductor device fabrication, choices of fabrication methods for depositing copper into very high aspect ratio features, such as a 10:1 aspect ratio, $0.1\mu$ wide vias are limited. Precursors for CVD deposition of copper are ill-developed, and physical vapor deposition into such features produces unsatisfactory results because of voids formed in the features.

As a result of these process limitations, plating which had previously been limited to the fabrication of lines on circuit boards, is just now being used to fill vias and contacts on semiconductor devices. Metal electroplating in general is well known in the art and can be achieved by a variety of techniques. However, a number of obstacles impair consistent reliable electroplating of copper onto semiconductor substrates having nanometer-sized, high aspect ratio features. Generally, these obstacles deal with providing uniform power distribution and current density across the substrate plating surface to form a metal layer having uniform thickness.

Present designs of cells for electroplating a metal on semiconductor substrates are based on a fountain plater configuration. FIG. 1 is a cross sectional view of a simplified fountain plater. Generally, the fountain plater 10 includes an electrolyte container 12 having a top opening, a substrate holder 14 disposed above the electrolyte container 12, an anode 16 disposed at a bottom portion of the electrolyte container 12 and a cathode 20 contacting the substrate 18. The cathode 20 comprises a plurality of contact pins distributed about the peripheral portion of the substrate 18 to provide a bias about the perimeter of the substrate. The contact pins generally provide a higher current density near the contact points on the substrate surface, resulting in a non-uniform deposition on the substrate surface. The semiconductor substrate 18 is positioned a fixed distance above the cylindrical electrolyte container 12, and the electrolyte impinges perpendicularly on the substrate plating surface. Because of the dispersion effects of the electrical current at the exposed edges of the substrate 18 and the non-uniform flow of the electrolyte, the fountain plater 10 provides non-uniform current distribution, particularly at the region near the edges and at the center of the substrate 18 that results in non-uniform plating of the metal. The electrolyte flow uniformity at the center of the substrate 18 can be improved by rotating the substrate 18. However, the plating uniformity still deteriorates as the boundaries or edges of the substrate are approached.

Furthermore, the fountain plater 10 presents additional difficulties in substrate transfers because the substrate has to be flipped for face-down plating. Generally, substrates are transferred by robots having robot blades with a substrate supporting surface, and the substrates are transferred with the surface to be processed face-up. Preferably, the robot blade does not contact the surface to be processed to eliminate risk of damaging the substrate surface. Because the fountain plater 10 requires face-down processing, additional devices are required to flip the substrate from a face-up transferring position to a face-down processing position.

Therefore, there remains a need for a reliable, consistent copper electroplating technique to deposit and form copper layers on semiconductor substrates having nanometer-sized, high aspect ratio features. There is also a need for a face-up electroplating system that allows fast substrate processing and increases throughput. Furthermore, there is a need for an apparatus for delivering a uniform electrical power distribution to a substrate surface and a need for an electroplating system that provides uniform deposition on the substrate surface.

SUMMARY OF THE INVENTION

The invention generally provides an apparatus and a method for electro-chemically depositing a uniform metal layer onto a substrate. More specifically, the invention provides an electro-chemical deposition cell for face-up processing of semiconductor substrates comprising a substrate support member, a cathode connected to the substrate plating surface, an anode disposed above the substrate support member and an electroplating solution inlet supplying an electroplating solution fluidly connecting the anode and the substrate plating surface. Preferably, the anode comprises a consumable metal source disposed in a liquid permeable structure, and the anode and a cavity ring define a cavity for holding and distributing the electroplating solution to the substrate plating surface.

The invention also provides a substrate support member for face-up electroplating. Preferably, the substrate support member comprises a vacuum chuck having vacuum ports disposed on the substrate supporting surface that serves to provide suction during processing and to provide a blow-off gas flow to prevent backside contamination during substrate transfers. The substrate support member also rotates and vibrates during processing to enhance the electro-deposition onto the substrate plating surface.

Another aspect of the invention provides a dual catch-cup system comprising an electroplating solution catch-cup and a rinse catch-cup. The dual catch-cup system provides separation of the electroplating solution and the rinse solutions during processing and provides re-circulating systems for the different solutions of the electroplating system.

The invention also provides an apparatus for delivering electrical power to a substrate surface comprising an annular ring electrically connected to a power supply, the annular ring having a contact portion to electrically contact a peripheral portion of the substrate surface. Preferably, the contact portion comprises annular surface, such as a metal impregnated elastomer ring, to provide continuous or substantially continuous electrical contact with the peripheral portion of the substrate. The invention provides a uniform distribution of power to a substrate deposition surface by providing a uniform current density across the substrate deposition surface through the continuous annular contact portion. The invention also prevents process solution contamination of the backside of the substrate by providing a seal between the contact portion of the annular ring and the substrate deposition surface.

Another aspect of the invention provides an apparatus for holding a substrate for electro-chemical deposition comprising a substrate holder having a substrate support surface and an annular ring electrically connected to a power supply, the annular ring having a contact portion to electrically contact a peripheral portion of the substrate surface. The substrate holder is preferably connected to one or more actuators that provide rotational movement and/or vibrational agitation to the substrate holder during processing to enhance deposition uniformity. Preferably, the substrate holder comprises a vacuum chuck having a substrate supporting surface, and an O-ring is disposed around a substrate supporting surface to seal the backside of the substrate from contamination by the processing solutions.

BRIEF DESCRIPTION OF THE DRAWINGS

So that the manner in which the above recited features, advantages and objects of the present invention are attained can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The invention generally provides an electro-chemical deposition cell wherein a substrate is positioned with a deposition surface "face up." An electroplating solution is pumped through a top portion of the cell over the exposed substrate deposition surface and collected in a peripheral catch cup drain about the perimeter of the substrate. Additionally, the cell includes means for in situ cleaning and/or rinsing of the electro-chemically deposited substrate.

Figure 1:
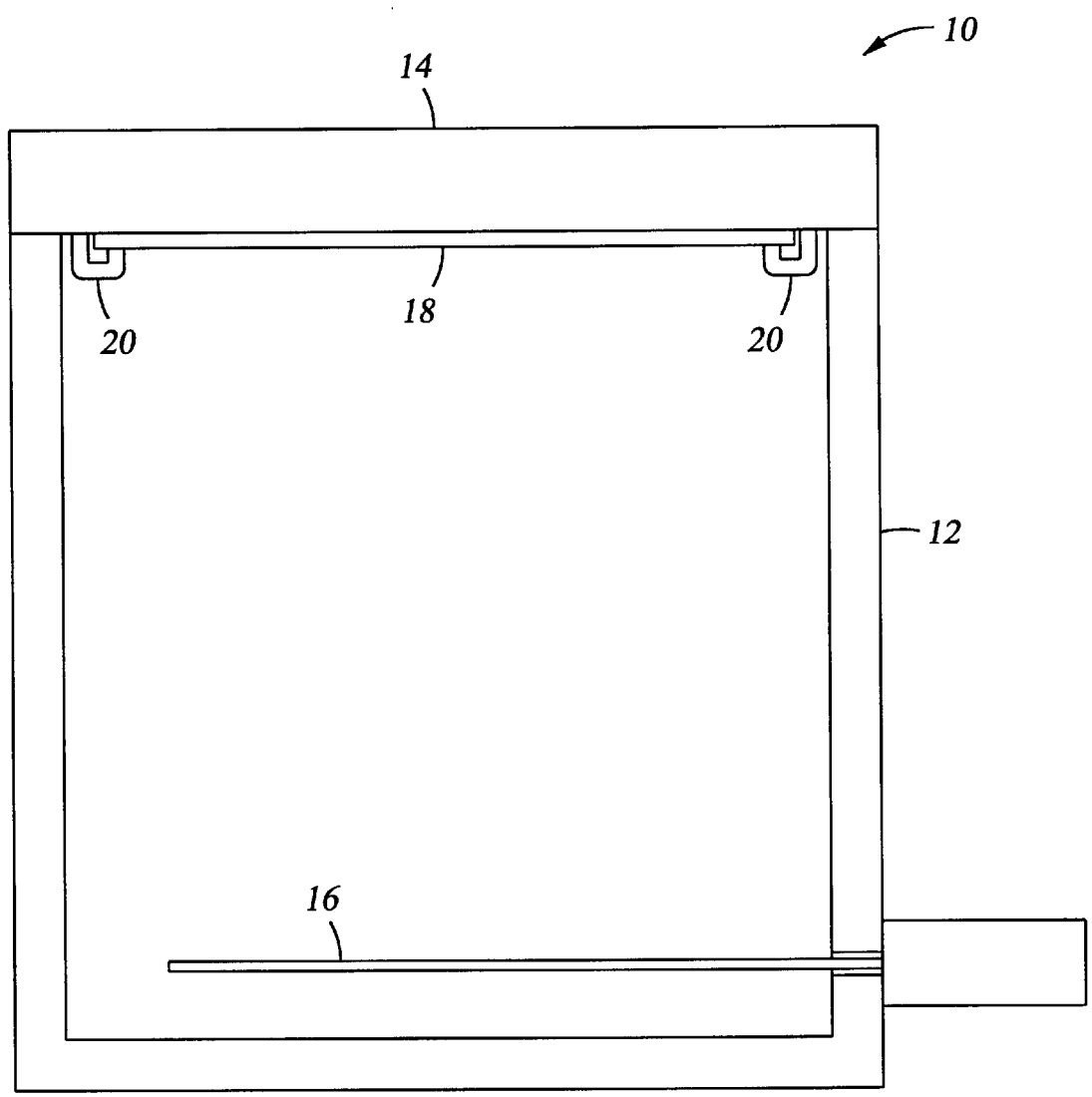
FIG. 1 is a cross sectional view of a simplified fountain plater.
Figure 2:
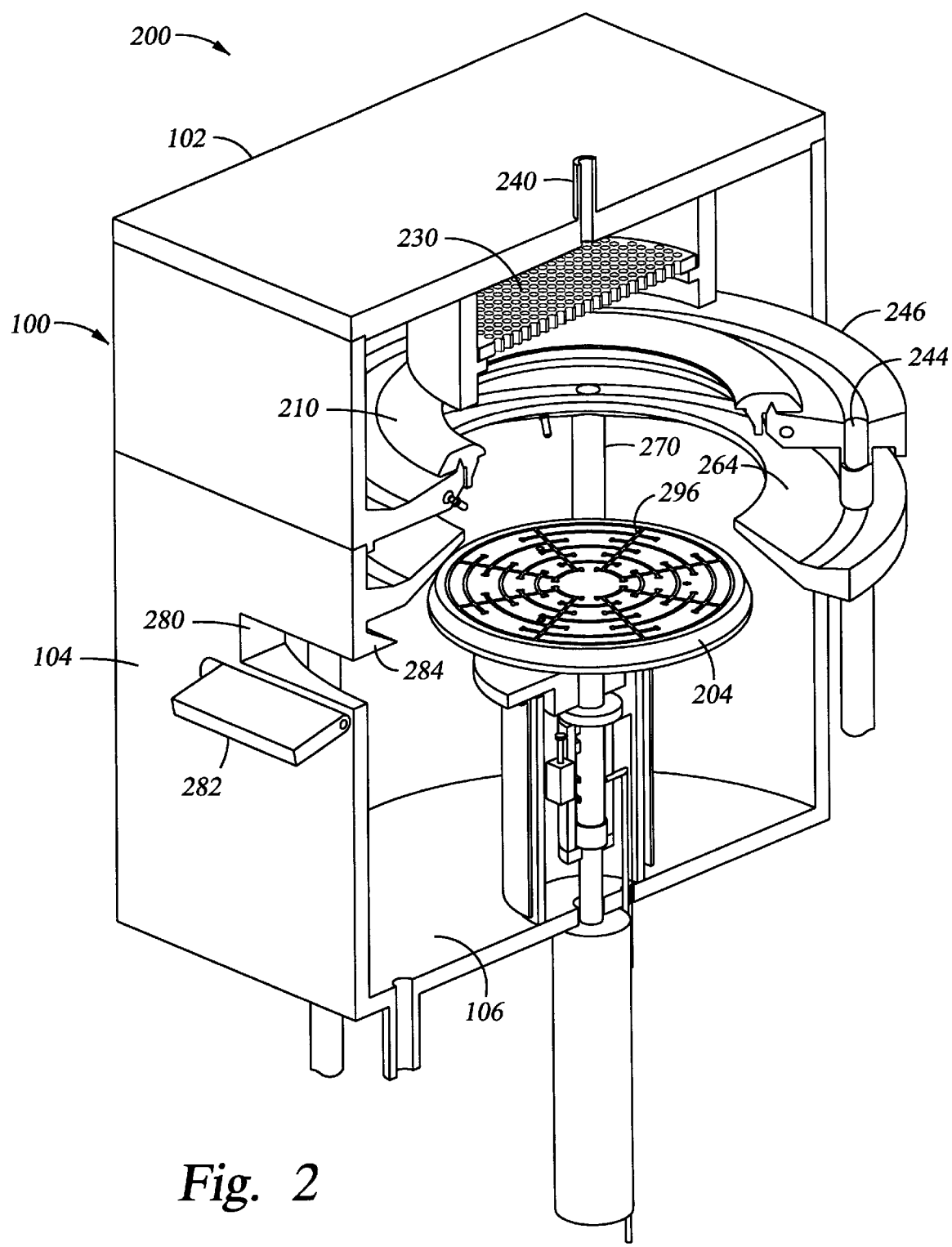
FIG. 2 is a partial cut-away perspective view of an electro-chemical deposition cell showing the interior components of the electro-chemical deposition cell.

FIG. 2 is a partial cut-away perspective view of an electro-chemical deposition cell showing the interior components of the electro-chemical deposition cell. Generally, the electro-chemical deposition cell 200 comprises a substrate support member 204, a cathode clamp ring 210, an anode plate 230 above the cathode clamp ring 210 and an electroplating solution inlet 240 supplying an electroplating solution into the electro-chemical deposition cell 200 above the substrate or in the flow direction of the substrate surface to be plated.

The electro-chemical deposition cell 200 includes a cell enclosure 100 comprising an enclosure lid 102, an enclosure side wall 104 and an enclosure bottom 106. Preferably, the enclosure 100 has a cylindrical interior and is made of an electrically insulative material. The enclosure side wall 104 includes a slit opening 280 for transfer of substrates into and out of the electro-chemical deposition cell 200, and a slit valve 282 disposed on an outer surface of the enclosure side wall 104 opens only during the substrate transfer operation and covers the slit opening 280 during processing to provide a sealed processing environment. A drip awning 284 is preferably disposed above the slit opening 280, extending inwardly from an inner surface of the enclosure side wall 104, to guard the opening 280 from direct receipt of the electroplating solution and thus prevent a processing solution from leaking out of the cell through the slit opening 280.

Figure 3:
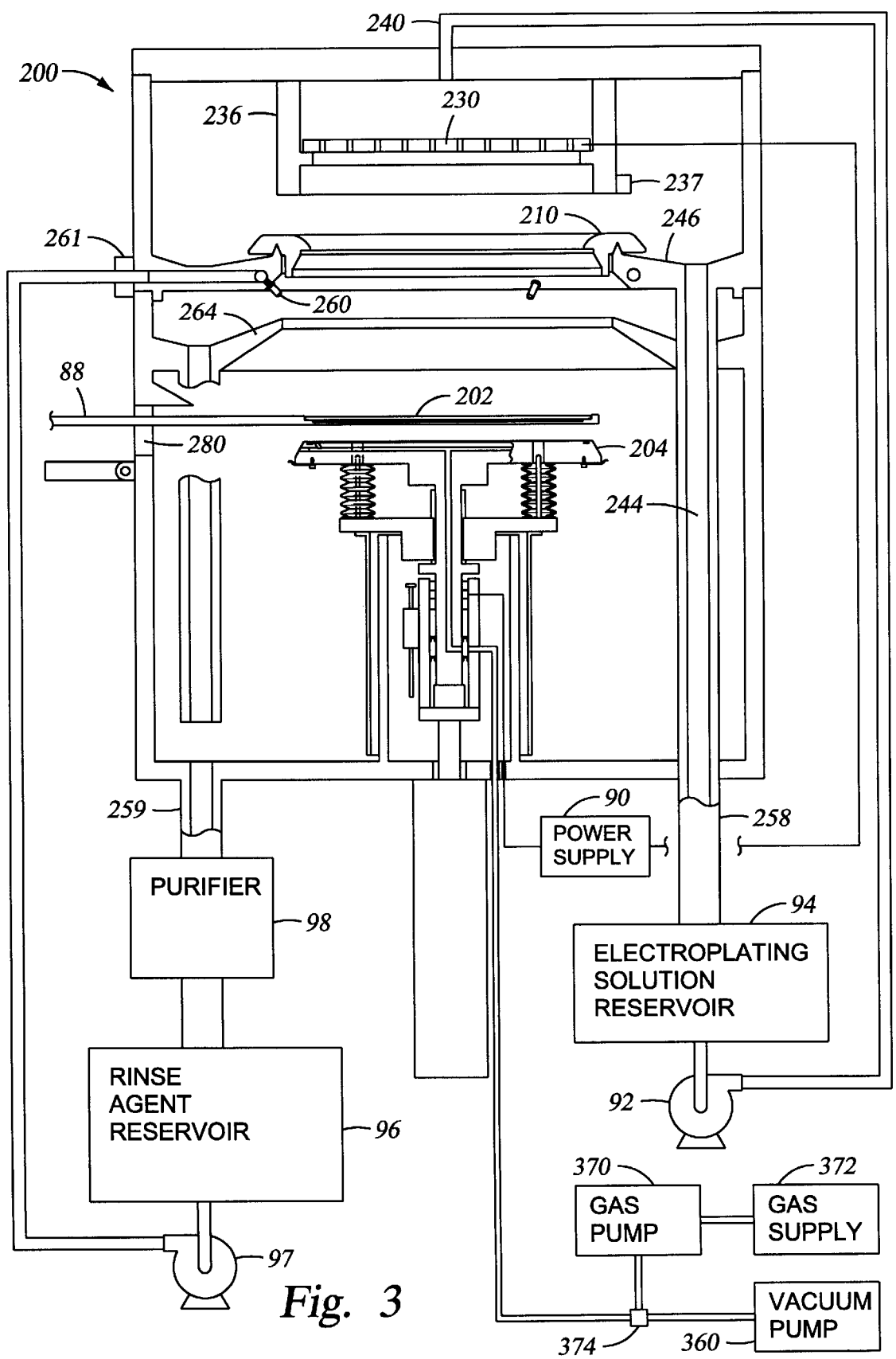
FIG. 3 is a cross sectional schematic view of an electro-chemical deposition cell 200 showing a robot blade transferring a substrate 202 into the electro-chemical deposition cell 200.
Figure 4:
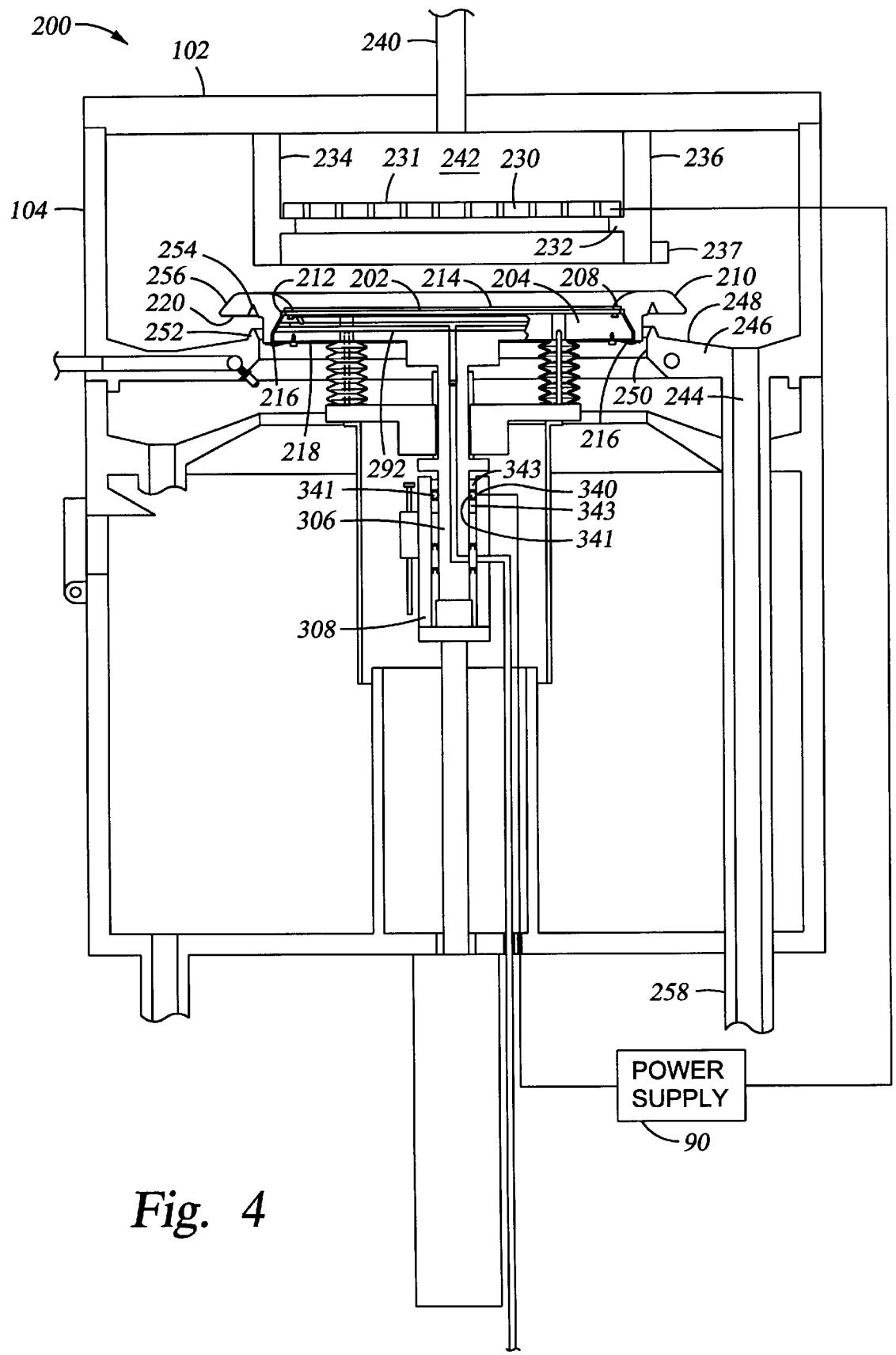
FIG. 4 is a cross sectional schematic view of an electro-chemical deposition cell 200 having a substrate 202 disposed on a substrate support member 204 in a processing position according to the invention.

Referring to FIG. 3, where the electro-chemical deposition cell 200 is shown with the substrate support member 204 in a load/transfer position, as well as FIG. 4, where the electro-chemical deposition cell 200 is shown in a plating/processing position, the anode plate 230 is disposed within a cavity ring 236 at a top portion of the electro-chemical deposition cell 200. The anode plate 230 is electrically connected to a power supply 90. The substrate support member 204 is disposed at a bottom portion of the electro-chemical deposition cell 200. The cathode clamp ring 210, preferably supported by an annular electroplating solution catch cup 246, is disposed in a middle portion of the electro-chemical deposition cell 200 between the substrate support member 204 and the anode plate 230. The cathode clamp ring 210 is positioned in the electro-chemical deposition cell 200 such that the movement of the substrate support member 204 from the load/transfer position (FIG. 3) to the processing position (FIG. 4) lifts the cathode clamp ring 210 slightly off the annular electroplating solution catch cup 246. Once in the processing position, an electroplating solution pump 92, which is connected to the electroplating solution inlet 240, pumps the electroplating solution from an electroplating solution reservoir 94 into the electro-chemical deposition cell 200. Preferably, an electroplating solution outlet 258 is connected to an electroplating solution drain 244 on the electroplating solution catch cup 246 to return the electroplating solution back to the electroplating solution reservoir 94 to be re-circulated through the electro-chemical deposition cell 200.

Figure 5:
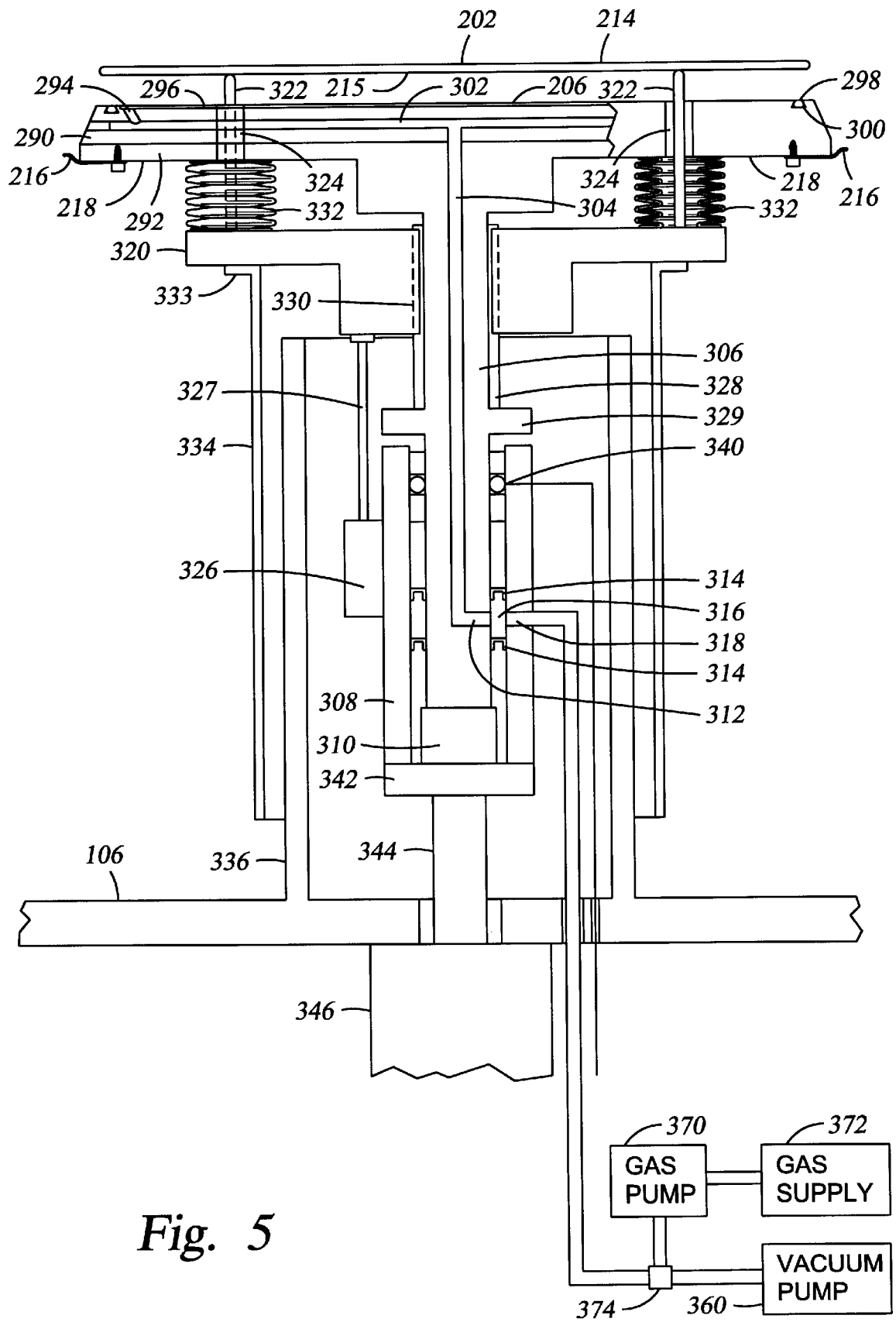
FIG. 5 is a cross sectional view of a substrate support member 204 in a transferring position having a substrate disposed on elevated lift pins.

FIG. 3 is a cross sectional schematic view of an electro-chemical deposition cell 200 showing a robot blade 88 transferring a substrate 202 into the electro-chemical deposition cell 200, and FIG. 5 is a cross sectional schematic view of a substrate support member 204 in a transferring position according to the invention. By comparing FIGS. 2A and 3A, the sequence for loading and unloading a substrate may be seen. Referring initially to FIG. 3, a robot blade 88 transfers a substrate 202 into the electro-chemical deposition cell 200 through the slit opening 280 and positions the substrate 202 above the substrate support member 204. At the substrate transferring position, the substrate support member 204 is retracted fully to a bottom portion of the electro-chemical deposition cell 200. Then, as shown in FIG. 5, a plurality of lift pins 322 extend through vertical bores 324 in the substrate support member 204 and lift the substrate 202 above the robot blade 88. The robot blade 88 then retracts out of the chamber, and the slit valve 282 closes the slit opening 280.

Referring to FIG. 5, the substrate support member 204 comprises a vacuum chuck 290 made of an insulating material and a conductive base plate 292 providing a cathode connection to the cathode clamp ring 210. The vacuum chuck 290 secures a substrate 202 onto a substrate supporting surface 206 on the substrate support member 204 during processing. Preferably, one or more vacuum ports 294 are disposed in the substrate support member 204 and are connected to one or more vacuum channels 296 disposed on the substrate supporting surface 206 to secure the substrate 202 through vacuum suction. The vacuum channels 296 are generally disposed evenly across the surface of the substrate member in a web-like fashion (as shown in FIG. 2).

An outer seal 298, comprising an O-ring, or alternatively, a double O-ring, disposed in a recess 300 surrounding the substrate supporting surface 206 is provided to create a vacuum seal between a backside 215 of the substrate 202 and the substrate supporting surface 206 when the vacuum chuck 290 is activated. The outer seal 298 also provides a seal against substrate backside contamination by the electroplating solution and other processing solutions. Eliminating the substrate backside contamination eliminates the need for a post deposition backside cleaning process, thus reducing system cost and complexity.

To provide a vacuum passage to the substrate supporting surface 206, a vacuum conduit 302 within the vacuum chuck 290 connects the vacuum ports 294 and vacuum channels 296 to a central vacuum conduit 304 within a rotating shaft 306. The rotating shaft 306 extends through a shaft sleeve 308 and is connected to a rotary actuator 310 disposed on a platform 342. The shaft sleeve 308 is also disposed on the platform 342 to maintain a fixed vertical relationship with the rotating shaft 306. A set of lip seals 314 disposed between the rotating shaft 306 and the shaft sleeve 308 allows free rotational movement of the rotating shaft 306 within the shaft sleeve 308 while providing a sealed region 316 between an outer surface of the rotating shaft 306 and an inner surface of the shaft sleeve 308. The central vacuum conduit 304 includes an opening 312 fluidly connecting the central vacuum conduit 304 and the sealed region 316. A vacuum outlet 318 extends through the shaft sleeve 308 and fluidly connects to the sealed region 316. A vacuum pump 360 is connected to the vacuum outlet 318 to provide a vacuum suction through the vacuum outlet 318, the sealed region 316, the opening 312, the central vacuum conduit 304, the vacuum conduit 302, the vacuum ports 294 and the vacuum channels 296 to hold the substrate 202 on the substrate support surface 206.

To provide a positive pressure between the substrate and the substrate support member 204, a gas pump 370 connected to a gas supply 372 is selectively connected through a control valve 374 to the vacuum outlet 318 to supply a blow off gas to the vacuum ports 294. The blow off gas prevents leftover rinsing agent from contaminating the backside of the processed substrate when the substrate is lifted above the substrate support member 204 and transferred out of the electro-chemical deposition cell 200. The control valve 374 shuts the connection to the vacuum pump 360 when the gas pump 370 is activated to pump the blow-off gas to the vacuum ports 294, and the control valve 274 shuts the connection to the gas supply 372 and the gas pump 370 when the vacuum pump 360 is activated to hold the substrate 202 on the support member 204. The vacuum ports 294 direct the blow off gas toward the backside edge of the substrate 202 to prevent any leftover rinsing agent from reaching the backside 215 of the substrate 202.

Figure 6:
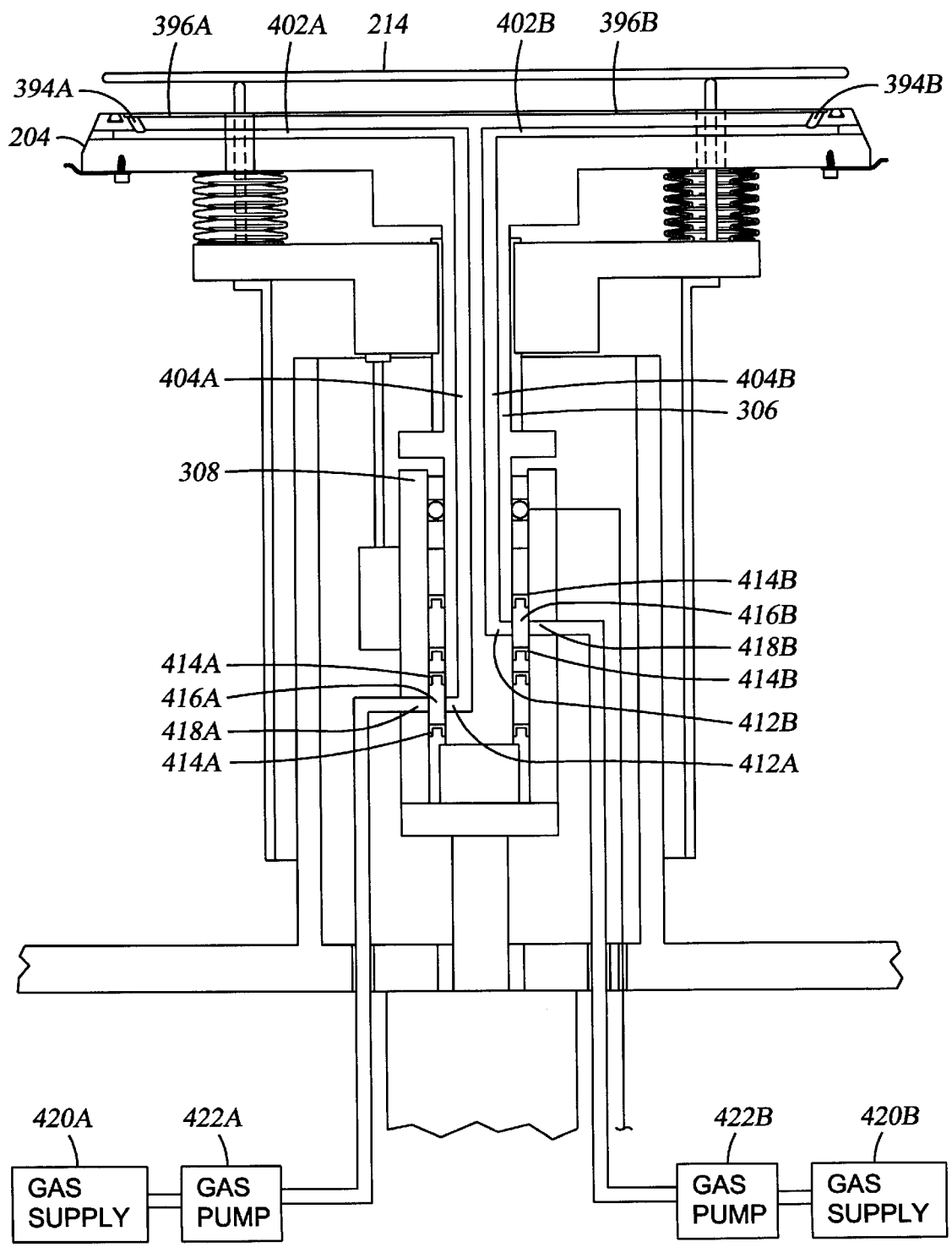
FIG. 6 is a cross sectional view of an alternative embodiment of the substrate support member 204 showing two separate fluid conduits and dual level lip seals.

FIG. 6 is a cross sectional view of an alternative embodiment of the substrate support member 204 showing two separate fluid conduits and dual level lip seals. Although the following describes a fluid delivery system for two separate fluids, the fluid delivery system may be adapted to accommodate a number of separate fluids by increasing the number of fluid conduits and lips seals. The embodiment as shown in FIG. 6 provides a substrate support member 204 capable of rotating while delivering two separate fluids through separate fluid conduits to the substrate support surface 206. Preferably, two separate sets of fluid channels 396A, 396B and fluid ports 394A, 394B are disposed on the substrate supporting surface 214, and two sets of fluid conduits 402A, 402B within the vacuum chuck are connected to two sets of central fluid conduits 404A, 404B extending through the rotating shaft 306. The first central fluid conduit 404A includes a first opening 412A fluidly connecting the first central fluid conduit 404A and a first sealed region 416A sealed by a first set of lip seals 414A. A first fluid inlet 418A extends through the shaft sleeve 308 and fluidly connects to the first seal region 416A. A first fluid supply 420A is connected to the first fluid inlet 418A through a first pump 422A. Likewise, the second central fluid conduit 404B includes a second opening 412B fluidly connecting the second central fluid conduit 404B and a second sealed region 416B sealed by a second set of lip seals 414B. A second fluid inlet 418B extends through the shaft sleeve 308 and fluidly connects to the second seal region 416B. A second fluid supply 420B is connected to the second fluid inlet 418B through a second pump 422B. The sets of lip seals 414A. 414B disposed between the rotating shaft 306 and the shaft sleeve 308 allows free rotational movement of the rotating shaft 306 within the shaft sleeve 308 while providing the sealed regions 416A, 416B between an outer surface of the rotating shaft 306 and an inner surface of the shaft sleeve 308. Thus, two separate fluids can be simultaneously delivered to the substrate supporting surface 214 while the substrate support member 204 is rotated. Alternatively, one of the pumps 422A and 422B is substituted with a vacuum pump to provide separate routes of vacuum suction and gas delivery to the substrate supporting surface 214. As another alternative, both of the gas pumps 422A and 422B may be substituted with two vacuum pumps to provide differential vacuum regions at the substrate supporting surface 214. Furthermore, more than two vacuum or fluid pumps may be used depending on the processing requirement. Although each sealed region described above preferably uses one set of lip seals (i.e., two lip seals), a subsequent sealed region (i.e., other than the first sealed region) requires only one additional lip seal. For example, three lip seals can create two sealed regions, one between the first lip seal and the second lip seal and another between the second lip seal and the third lip seal.

Referring back to FIG. 5, the rotating shaft 306 extends through a lift pin platform 320 having a plurality of lift pins 322 disposed thereon. The lift pins 322, preferably a set of four, extend through bores 324 through the substrate support member 204 to lift a substrate 202 above the substrate support surface 206. A lift platform actuator 326 moves the lift pin platform 320 vertically to lift and lower a substrate 202 for transfer into and out of the electro-chemical deposition cell 200. Preferably, the lift platform actuator 326 is disposed on an outer surface of the shaft sleeve 308 and includes a push rod 327 to actuate movement of the lift pin platform 320. To elevate the lift pin platform 320, the lift platform actuator 326 extends the push rod 327 to contact a bottom surface of the lift pin platform 320 and push the lift pin platform 320 upwards. To lower the lift pin platform 320, the lift platform actuator 326 retracts the push rod 327 to disengage the lift pin platform 320. When the push rod 327 of the lift platform actuator 326 is fully retracted, the push rod 327 does not contact the lift pin platform 320, and the lift pin platform 320 rests on a platform ridge 329 extending from an outer surface of the rotating shaft 306 above the shaft sleeve 308.

One or more vertical tabs 328 extend from an upper portion of the outer surface of the rotating shaft 306 into one or more matching vertical grooves 330 in the lift pin platform 320 so that the lift pin platform 320 rotates in unison with the rotating shaft 306. The tabs 328 also guide the lift pin platform 320 vertically when the lift pin platform is being moved by the lift platform actuator 326.

A flexible bellow 332, preferably made of polyethylene, is disposed around each lift pin 322 to provide a splash seal against electroplating solutions, rinsing solutions and other process chemicals. The flexible bellow 332 is attached from a top surface of the lift pin platform 320 to a bottom surface of the conductive base plate 292 of the substrate support member 204. The flexible bellow 332 compresses when the lift pin platform 320 is elevated by the lift platform actuator 326 and stretches when the lift pin platform 320 is resting on the platform ridge 329. Each flexible bellow 332 also maintains a seal when subjected to a slight side load, such as when the substrate support member rotationally accelerates or decelerates.

To prevent electroplating solutions, rinsing solutions and other process chemicals from contacting components disposed in the central portion of the electro-chemical deposition cell 200, such as the lift platform actuator 326 and the shaft sleeve 308, a splash guard 333 is attached to an outer portion of a lower surface of the lift pin platform 320. The splash guard 333 includes a cylindrical downward extension 334 that is disposed radially outward of an upwardly extending inner container wall 336. The inner container wall 336 is a cylindrical upward extension from the enclosure bottom 106 of the electro-chemical deposition cell 200 that holds the process solutions to be pumped out of the system through the outlet 259. The splash guard 334 and the inner container wall 336 create a sufficient overlap so that when the lift pin platform 320 is raised to it highest position during processing, there is still an overlap between the tip of the splash guard 334 and the tip of the inner container wall 336 (as shown in FIG. 4).

To provide rotational movement to the substrate support member 204, a rotary actuator 310 is disposed on a platform 342 and connected to the rotating shaft 306. The rotary actuator 310 rotates the rotating shaft 306 freely within the shaft sleeve 308. To move the substrate support member 204 vertically, an actuator 346 extends and retracts a shaft 344 connected to the platform 342. The actuator 346 is disposed outside of the enclosure 100 on the enclosure bottom 106, and the shaft 344 extends through the enclosure bottom 106 and is attached to a bottom surface of the platform 342. To maintain a fixed vertical relation with the rotating shaft 306 when the substrate support member 204 is elevated and lowered in the electro-chemical deposition cell 200, the shaft sleeve 308 is also disposed on the platform 342. Preferably, the actuator 346 also provides a vibrational agitation to the substrate support member 204 to enhance deposition onto the substrate deposition surface 214. Alternatively, a vibrator (not shown) can be attached to the substrate support member 204 to provide the vibrational agitation.

Referring to FIG. 3 and FIG. 4, the structure, operation and positioning of a cathode clamp ring 210 and an electroplating solution catch cup 246 will be discussed. The catch cup 246 is an annular structure extending inwardly from the enclosure side wall 104 of the electro-chemical deposition cell 200 to a bottom surface 220 of the cathode clamp ring 210. The cathode clamp ring 210 preferably includes an outer portion having a downwardly sloping surface 256 that overlaps an inner terminus 250 of the catch cup 246 to assist the electroplating solution flow into the catch cup 246. The inner terminus 250 includes a ridge 252 corresponding to a recess 254 on the bottom surface 220 of the cathode clamp ring 210.

The ridge 252 supports the cathode clamp ring 210 when the substrate support member 204 is not engaged in a deposition position. When the substrate support member is engaged in the deposition position as shown in FIG. 4, the cathode clamp ring 210 is lifted from the ridge 252 and is supported on the substrate deposition surface 214.

The electrical power is delivered by the cathode clamp ring 210 to the substrate deposition surface 214 through a contact portion 208 of the cathode clamp ring 210. To provide electrical power to the cathode clamp ring 210, one or more cathode contacts 216 are fixedly secured to a bottom surface 218 of the conductive base plate 292 of the substrate support member 204 and extends radially outwardly to electrically contact a bottom surface 220 of the cathode clamp ring 210. The electrical power is conducted through the rotating shaft 306 to the conductive base plate 292, then through one or more cathode contacts 216 secured onto the conductive base plate 292, and then to a bottom surface 220 of the cathode clamp ring 210. Preferably, the cathode contact 216 comprises a spring loaded metal strip that maintains constant electrical contact with the bottom surface 220 of the cathode clamp ring 210 during processing when the substrate support member 204 is rotated and/or vibrated. Alternatively, the cathode clamp ring 210 is fixedly connected to the power supply through connection wires (not shown).

To provide electrical power to the cathode clamp ring 210 while rotating the substrate support member 204 and the rotating shaft 306, a rotating cathode connection 340 is disposed at a top portion of the shaft sleeve 308 and connected to the power source 90. The rotating shaft 306 preferably comprises an electrically conductive material, and the rotating cathode connection 340 movably contacts the outer surface of the rotating shaft 306 to maintain electrical conduction to the rotating shaft 306 while the rotating shaft 306 is rotating. The rotating cathode connection 340 preferably comprises a plurality of conductive ball bearings 341 disposed between a pair of ring seals 343. Preferably, the rotating cathode connection 340 is filled with mercury to enhance the electrical conductivity of the rotating cathode connection 340 while the rotating shaft 306 is rotated.

Figure 7:
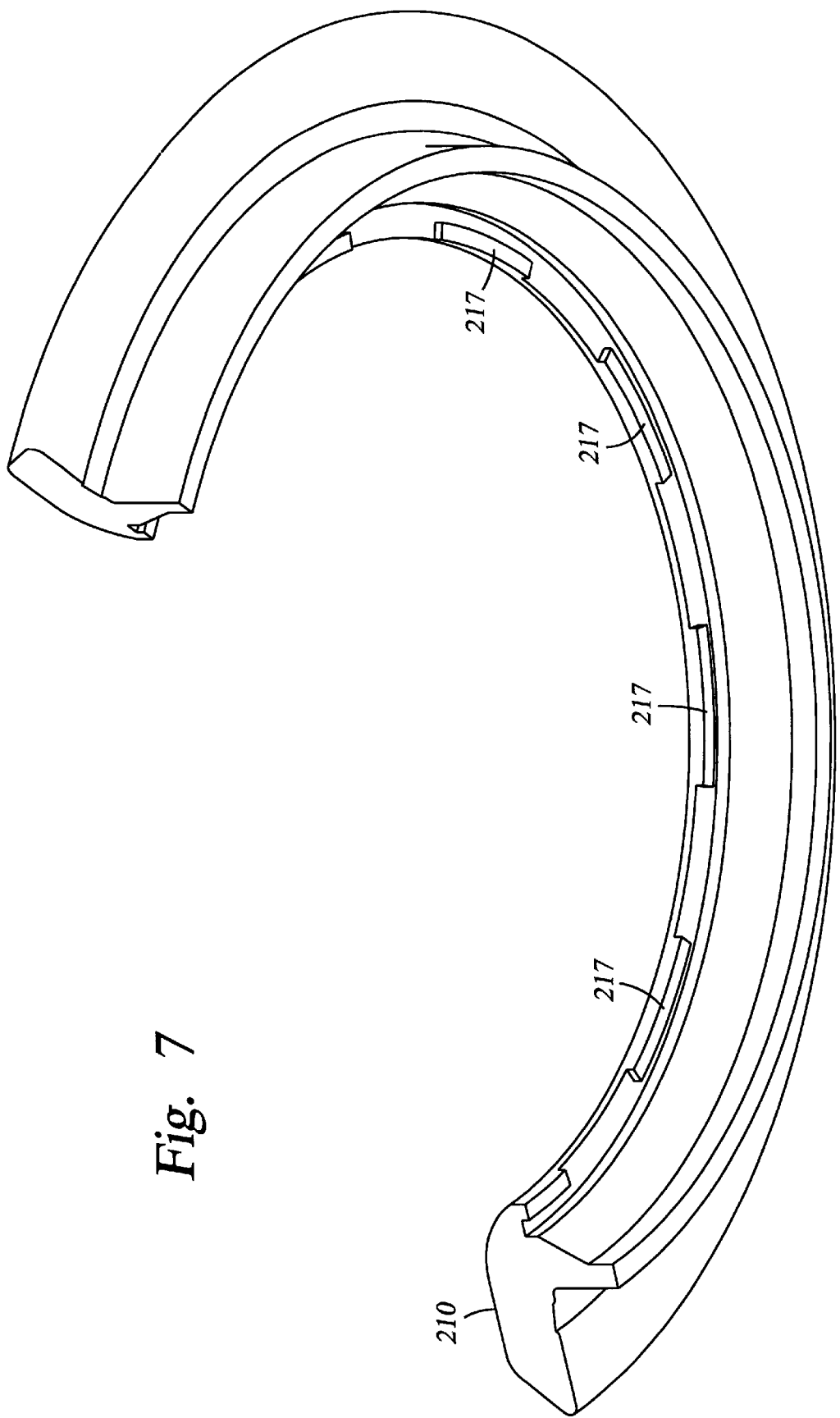
FIG. 7 is a bottom perspective view of a cathode clamp ring having an alternative embodiment of the contact portion comprising a plurality of contact pads.

Preferably, the cathode clamp ring 210 comprises an annular conductive member having a central opening defining the deposition area on a substrate deposition surface that is exposed to the electroplating solution during processing. The cathode clamp ring 210 is electrically connected to the power source 90 through the cathode contacts 216 and the substrate support member 204 and includes a contact portion 208 to electrically contact the substrate deposition surface 214 and to provide an electrical power (voltage and current) to the substrate deposition surface 214 to enable the electrochemical deposition process. The contact portion 208 preferably extends a minimal radial distance inward above a perimeter edge 212 of the substrate 202, but a distance sufficient to electrically contact a metal seed layer on the substrate deposition surface 214. Preferably, the contact portion 208 includes an annular surface providing a continuous contact around a peripheral portion of the substrate deposition surface 214. By providing a continuous electrical interface between the cathode and the substrate deposition surface, the electrical power is uniformly distributed on the substrate deposition surface 214. The increase in the electrical interface, as compared to an individual contact finger arrangement, also minimizes the fringing effect that occurs with individual cathode contact pins that cause non-uniform deposition. Alternatively, the contact portion 208 comprises a plurality of contact pads 217 (as shown in FIG. 7) positioned to contact substantially around the peripheral portion of the substrate deposition surface 214.

While the cathode clamp ring 210 is engaged with the substrate 202, cathode clamp ring 210 rotates with the substrate support member 204 because of the frictional force between the contact portion 208 and the substrate deposition surface 214. Preferably, the cathode clamp ring 210 includes a plurality of locking grooves (not shown) disposed on the bottom surface 220 to receive the cathode contacts 216. With the cathode contacts 216 engaged in the locking grooves, the cathode clamp ring 210 rotates synchronously with the substrate support member 204 without depending on the frictional force between the contact portion 208 and the substrate deposition surface 214.

Figure 8:
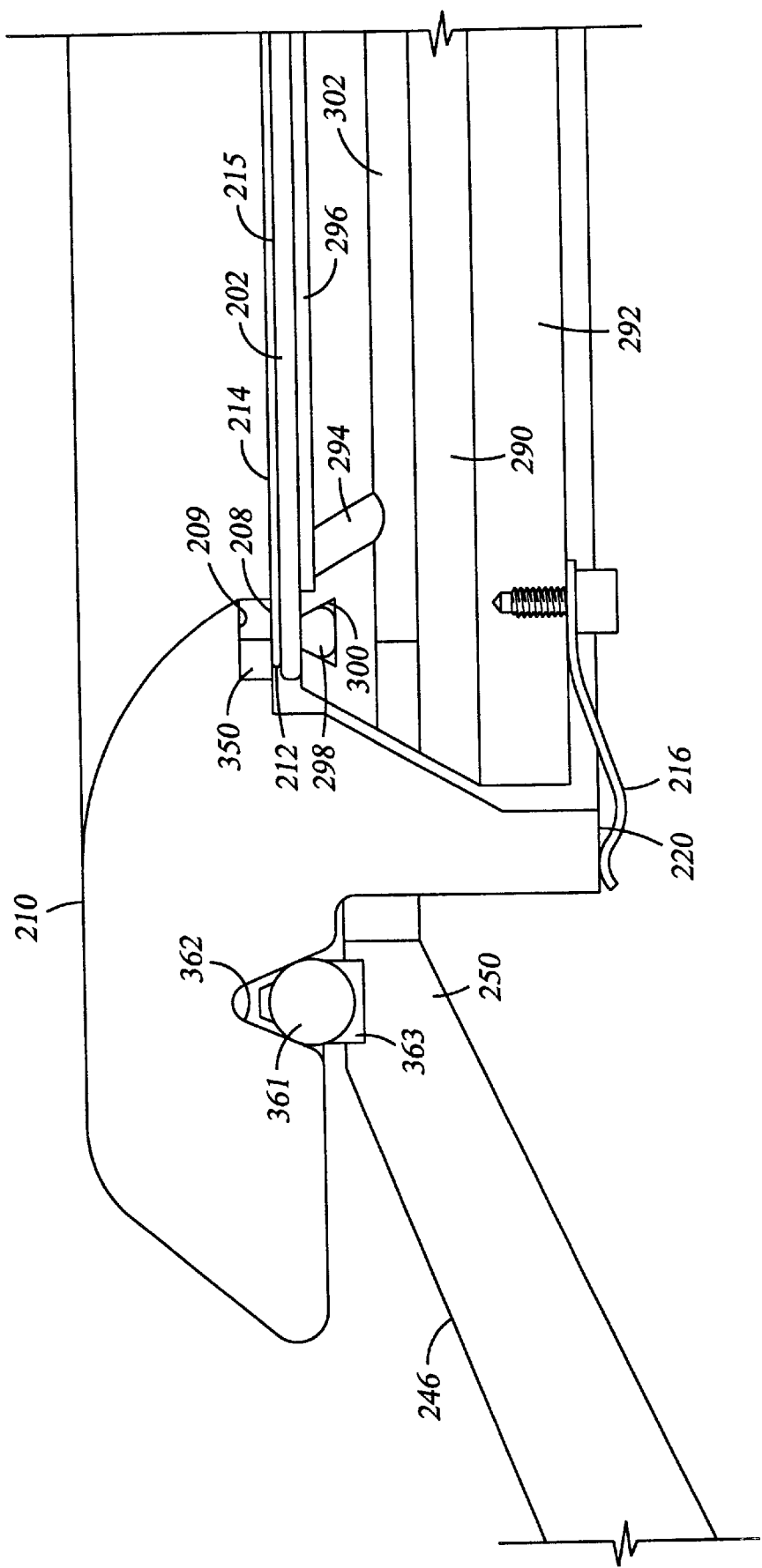
FIG. 8 is a partial cross sectional schematic view of another embodiment of a cathode clamp ring.

FIG. 8 is a partial cross sectional schematic view of another embodiment of a cathode clamp ring. In this embodiment, the cathode clamp ring 210 includes a contact portion 208 comprising a metal impregnated elastomer ring 350 electrically contacting Z peripheral portion of the substrate deposition surface 214. The metal impregnated elastomer ring 350 is disposed on a ridge 351 on a stepped surface 209 of the cathode clamp ring 210.

The metal impregnated elastomer ring 350 is secured to the stepped surface 209 of the cathode clamp ring 210 by an adhesive that is unaffected by the electroplating solution and process. Alternatively, the metal impregnated elastomer ring 350 is secured to the stepped surface 209 of the cathode clamp ring 210 by a fastener (not shown) such as a screw or a bolt. As another alternative, the cathode clamp ring 210 includes an annular dove-tail groove (not shown) disposed on the stepped surface 209 that squeezes and holds the metal impregnated elastomer ring 350.

Figure 9:
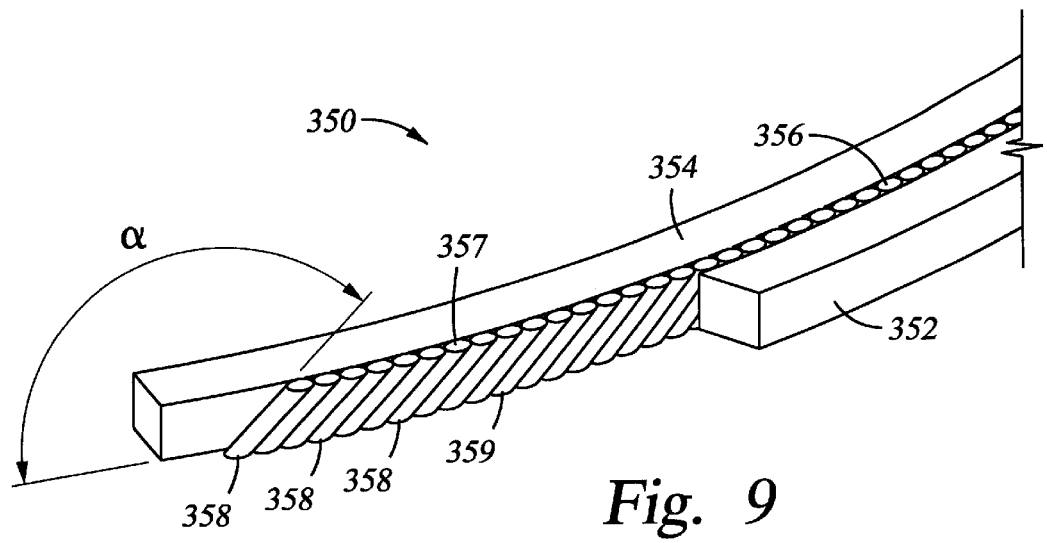
FIG. 9 is a cross sectional partial view of a cathode clamp ring showing another embodiment of a contact portion of the clamp ring.

The metal impregnated elastomer ring 350 provides electrical conduction through metal particles or short wires disposed in a hydrophobic elastomer matrix. FIG. 9 is a cutaway perspective of a section of an embodiment of a metal impregnated elastomer ring 350. The metal impregnated elastomer ring 350 generally comprises an outer elastomer ring 352, an inner elastomer ring 354 and a metal ring 356 sandwiched between the inner elastomer ring 352 and the outer elastomer ring 354. Preferably the metal ring 356 comprises a plurality of individual metal wires 358 extending at a slanted angle a (other than perpendicular to a top and/or a bottom surface of the elastomer ring 350) from a top surface of the elastomer ring 350 to a bottom surface of the elastomer ring 350. The metal wires 358 conduct electrical power from the cathode clamp ring 210 to the substrate deposition surface 214. A top end 357 of the metal wires 358 contacts the cathode clamp ring 210, and a bottom end 359 of the metal wires 358 contacts the substrate deposition surface 214. The slanted angle a of the metal wires 358 enhances the ability of the metal impregnated elastomer ring 350 to compress and form a seal on the substrate deposition surface 214 while providing electrical contact to the substrate deposition surface 214, i.e., by the individual metal wires sliding relative to each other and increasing the angle $\alpha$ as needed. One exemplary metal impregnated elastomer ring is available from Shin-Etsu Handotai America, Inc., Vancouver, Wash. The metal impregnated elastomer ring 350 provides a compliant contacting interface with the substrate deposition surface 214 that reduces the risk of scratching the substrate deposition surface 214 by the contact portion 208 of the cathode clamp ring 210. The metal impregnated elastomer ring 350 also seals the contact interface from the process solutions so that the metal conductors in the elastomer matrix are not exposed to the processing solutions which can change the properties of the metal conductors. Although one embodiment of the metal impregnated matrix is discussed above, the invention contemplates other embodiments of metal impregnated elastomers having different arrangements of electrically conductive particles within the elastomer matrix for use as the contact portion 208 of the cathode clamp ring 210.

Figure 10:
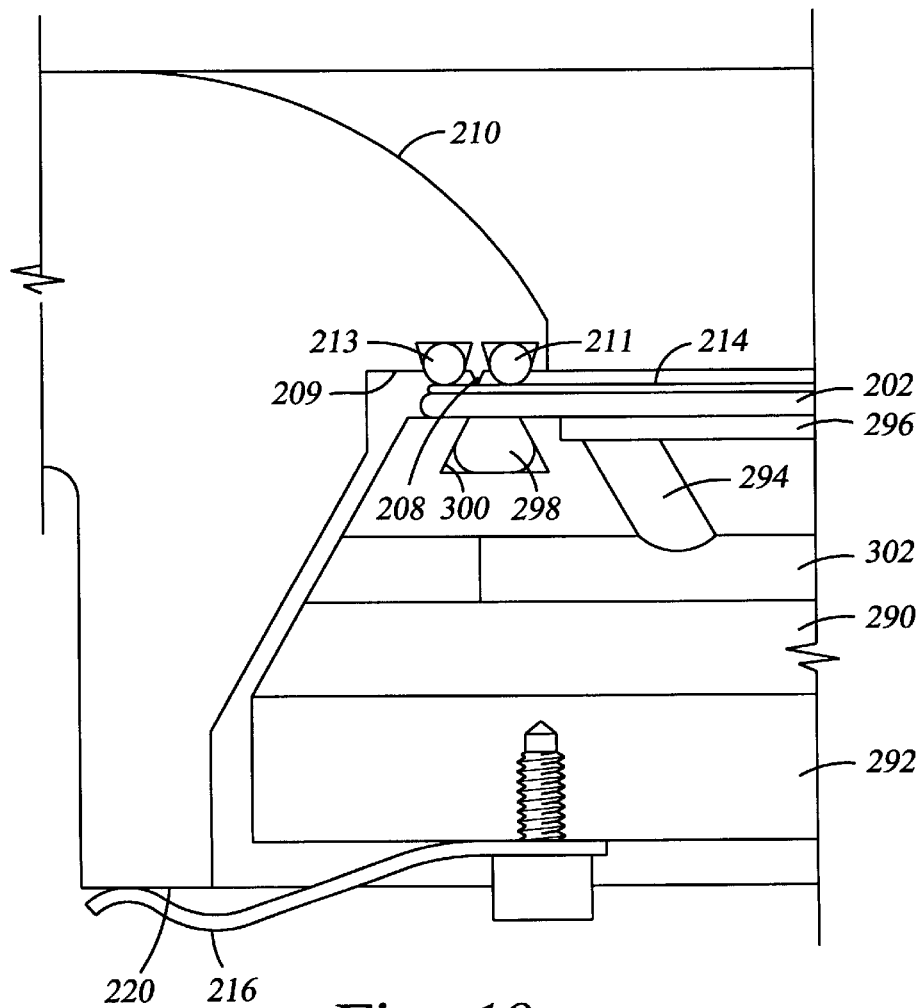
FIG. 10 is a see-through perspective of a section of an embodiment of a metal impregnated elastomer ring 350.

FIG. 10 is a cross sectional partial view of a cathode clamp ring showing another embodiment of a contact portion of the clamp ring. In this embodiment, the contact portion 208 of the cathode clamp ring 210 comprises an annular downward extension of the conductive metal from a bottom surface 209 of the cathode clamp ring 210. The annular down ward extension is preferably a wedge-shaped annular ring. An inner concentric O-ring 211 and an outer concentric O-ring 213 are attached to the bottom surface 209 of the cathode clamp ring 210 surrounding the contact portion 208. The O-rings 211 and 213 provide a sealed environment for the contact portion 208 during the electrochemical deposition process while the contact portion 208 conducts electrical power to the substrate deposition surface 214.

Referring back to FIG. 8, an alternative embodiment of a support for the cathode clamp ring 210 utilizes a kinematic coupling between the cathode clamp ring 210 and the inner terminus 250 of the catch cup 246. Utilizing kinematic coupling allows positive location of concentric parts such as the cathode clamp ring 210 in relation with the electroplating solution catch cup 246. The kinematic coupling generally comprises a plurality of ball bearings 361 (only one shown) disposed partially in a plurality of seats 363 on a top surface of the inner terminus 250 and a corresponding groove 362 on a bottom surface of the cathode clamp ring 210 to receive a top portion of the ball bearing 361. Preferably, the kinematic coupling uses three ball bearings 361 to center the cathode clamp ring 210. One ball bearing locates the radial position while the other two ball bearings locate the angular position of the clamp ring 210.

Figure 11:
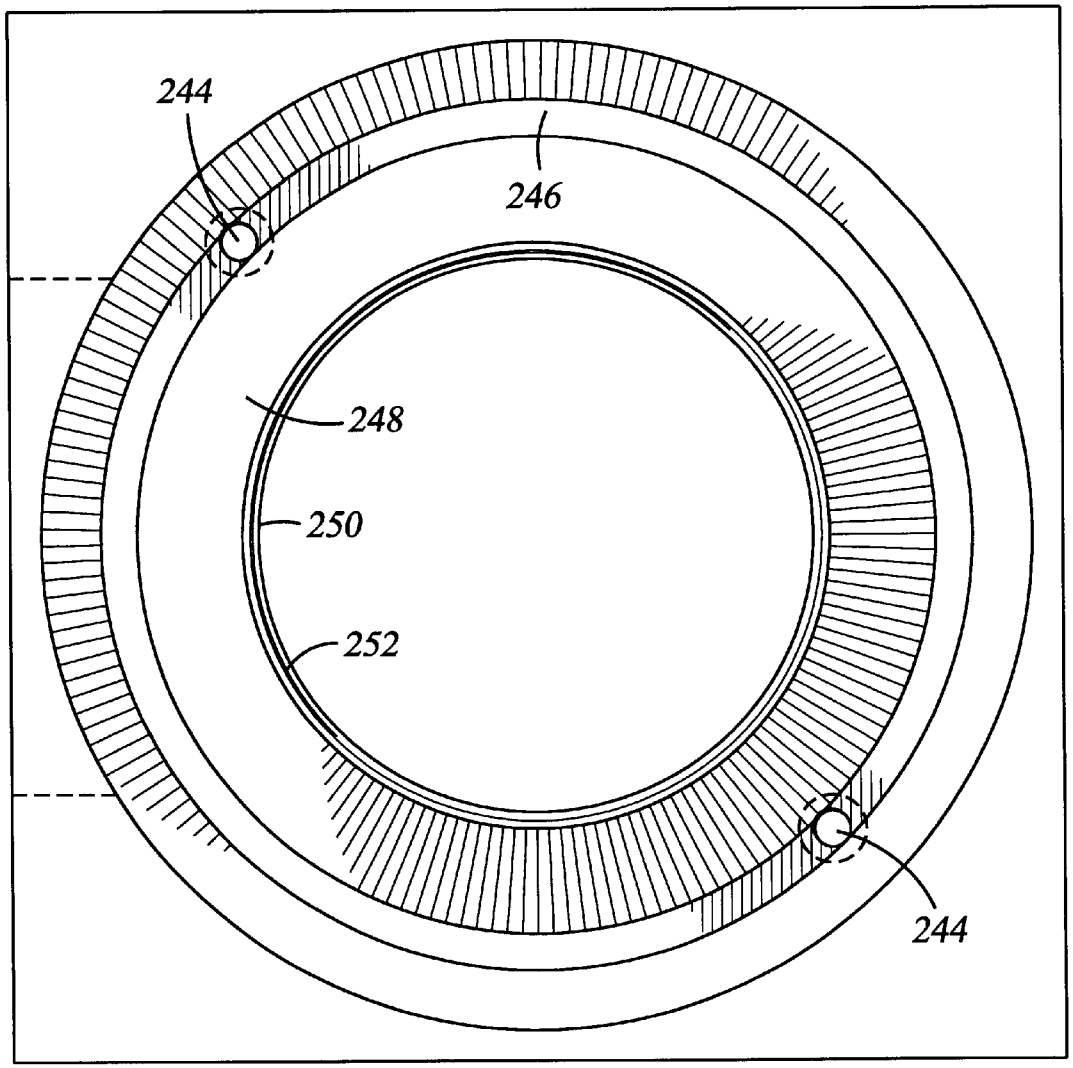
FIG. 11 is a top view of an electroplating solution catch cup 246.

Referring to FIG. 11, where a top view of an electroplating solution catch cup 246 is shown, preferably two electroplating solution drains 244 are disposed diametrically in opposing corners of the electro-chemical deposition cell 200. Referring back to FIG. 3 and FIG. 4, the electroplating solution catch cup 246 is disposed in a middle portion of the electro-chemical deposition cell 200 to direct the electroplating solution to one or more electroplating solution drains 244. During processing, the electroplating solution is pumped through the electroplating solution inlet 240 into the cavity 242, passes through the anode plate 230 onto the substrate deposition surface 214 (see FIG. 4) and then flows over a cathode clamp ring 210 into an electroplating solution drain 244 of a catch cup 246. The catch cup 246 includes a downwardly sloping top surface 248 from an inner terminus 250 to the electroplating solution drain 244 to direct the electroplating solution overflowing the cathode clamp ring 210 to the electroplating solution drain 244. The size (inner diameter) of the electroplating solution drain 244 and the slope and length of the top surface 248 is adapted to accommodate a particular flow rate so that the electroplating solution does not overflow the catch cup 246 and spill over the ridge 252. The electroplating solution drain 244 is connected to an electroplating solution outlet 258 that transports the processed electroplating solution to the electroplating solution reservoir 94. The electroplating solution is then pumped to the electroplating solution inlet 240 and re-circulates through the electro-chemical deposition cell 200.

Referring back to FIG. 3 and FIG. 4, a cavity ring 236 comprising a generally cylindrical structure is disposed at a top potion of the electro-chemical deposition cell 200 to hold an anode plate 230 and the electroplating solution to be distributed through the anode plate 230. The anode plate 230 is disposed at a bottom portion of the cavity ring 236 on a ridge 232 extending inwardly from an inner surface 234 of the cavity ring 236. The inner surface 234 of the cavity ring 236 and the top surface 231 of the anode plate 230 define a cavity 242 for holding the electroplating solution to be distributed through the anode plate 230. An electroplating solution inlet 240 disposed on the enclosure lid 102 supplies the electroplating solution into the cavity 242. The electroplating solution inlet 240 is connected to an electroplating solution pump 92 that pumps the electroplating solution from an electroplating solution reservoir 94.

Preferably, the anode plate 230 has substantially the same shape as the substrate deposition surface 214 and includes a plurality of perforations to distribute the electroplating solution uniformly across the substrate deposition surface 214. The anode plate 230 is electrically connected to a power source 90 and preferably comprises a consumable metal that can dissolve in the electroplating solution to provide the metal particles to be deposited onto the substrate deposition surface 214. As the electroplating solution passes through an energized anode plate 230, metal ions dissociate from the surface of the consumable metal anode plate 230 into the electroplating solution.

Alternatively, the anode plate 230 comprises an electrode and consumable metal particles encased in a fluid permeable membrane such as a porous ceramic plate. An alternative to the consumable anode plate is a non-consumable anode plate that is perforated or porous for passage of the electroplating solution therethrough. However, when a non-consumable anode plate is used, the electroplating solution requires a metal particle supply to continually replenish the metal particles to be deposited in the process.

To enhance the deposition process, an agitator 237 is preferably attached to the cavity ring 236 to agitate the electroplating solution. The agitator 237 generally comprises a megasonic or an ultrasonic finger that transfers a vibration to the electroplating solution by vibrating the cavity ring 236.

After the electroplating process is finished, no more electroplating solution is pumped into the cell 200, and the electroplating solution is drained from the cell 200 through the electroplating solution drains 244. However, some electroplating solution may collect on the anode plate 230 and the cavity ring 236 and then drip onto the processed substrate deposition surface 214. To control dripping of residual electroplating solution from the anode/cavity ring assembly to the substrate deposition surface after the deposition phase, the anode/cavity ring assembly is preferably moved away from the region above the substrate.

Figure 12:
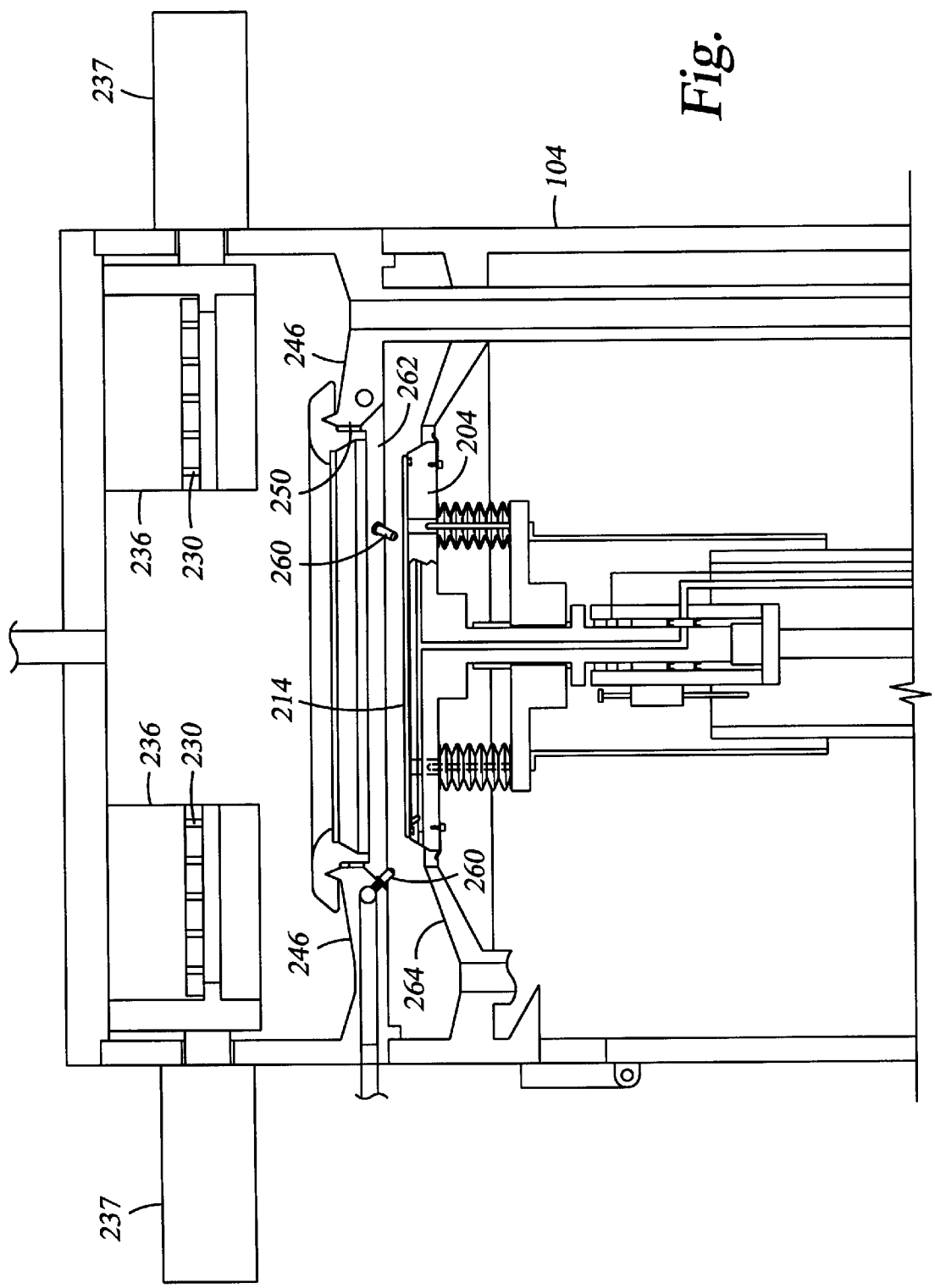
FIG. 12 is a cross sectional schematic view of an electro-chemical deposition cell 200 showing one embodiment of the anode/cavity ring assembly for drip control where a substrate support member 204 is shown positioned in a rinsing position according to the invention.

FIG. 12 shows one embodiment of the anode/cavity ring assembly for drip control where a substrate support member 204 is shown positioned in a rinsing position according to the invention. Preferably, the assembly of the cavity ring 236 and the anode plate 230 comprises two symmetrical halves split by a central vertical plane. An actuator 237 is connected to each half to pull apart the anode/cavity ring assembly after the deposition phase of the process. Each half of the anode/cavity ring assembly is moved to the region above the electroplating solution catch cup 246 so that the residual electroplating solution drips into the electroplating solution catch cup.

Figure 13:
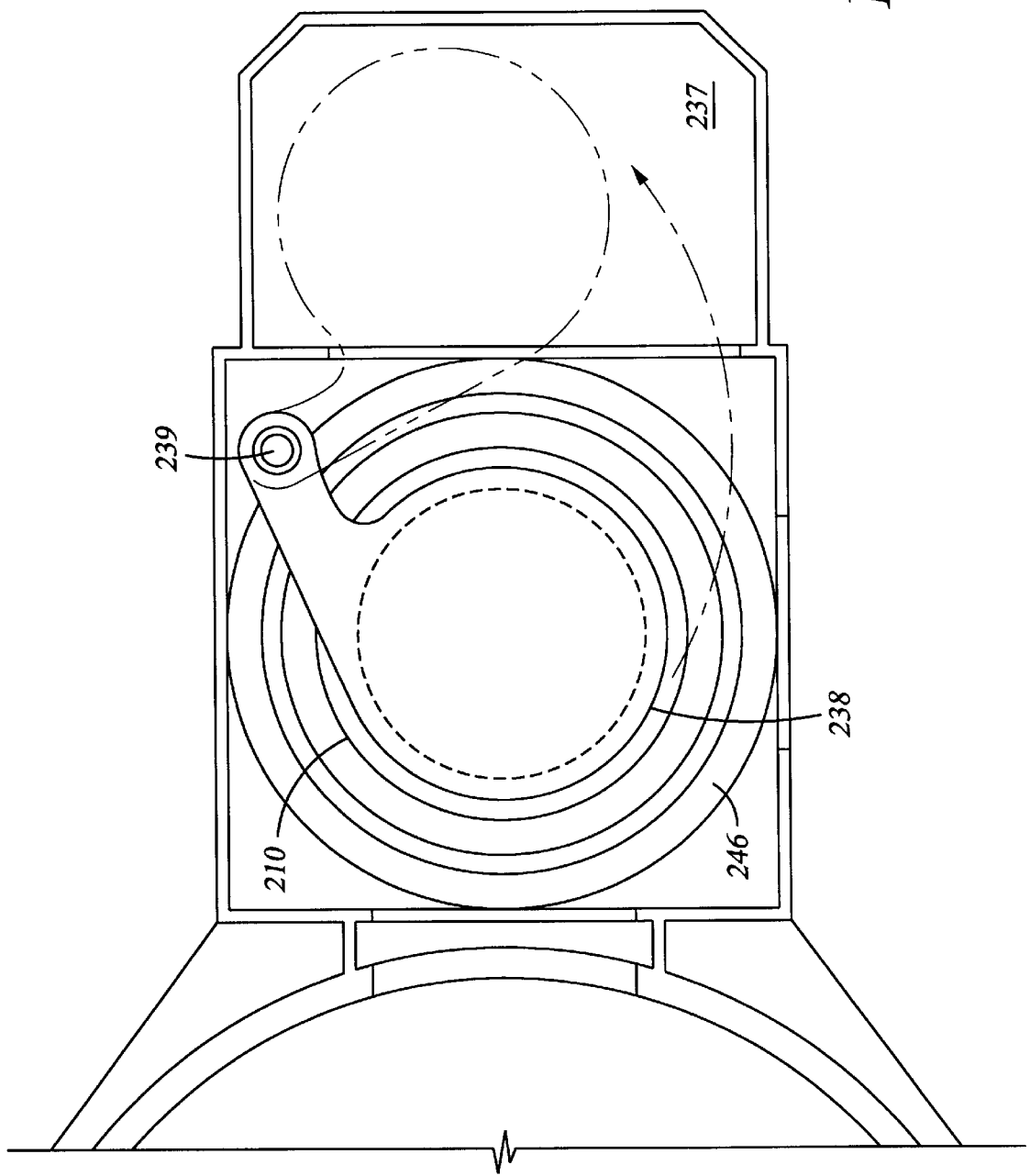
FIG. 13 is a top view of a shutter plate 238 positioned above cathode clamp ring 210, showing an alternative solution for controlling the dripping of residual electroplating solutions from the anode/cavity ring assembly.

FIG. 13 is a top view of a shutter plate 238 positioned above cathode clamp ring 210, showing an alternative solution for controlling the dripping of residual electroplating solutions from the anode/cavity ring assembly. A shutter plate 238 moves into the region between the anode/cavity ring assembly and the cathode clamp ring 210 to block the dripping residual electroplating solution from contaminating the processed substrate deposition surface. Preferably, the shutter plate 238 is attached to a rotary shutter actuator 239 and retracted into a shutter plate chamber 237 during the deposition process. Once the deposition phase is completed, the rotary shutter actuator 239 rotates the shutter plate 238 below the anode/cavity ring assembly and blocks the dripping residual electroplating solution.

Figure 14:
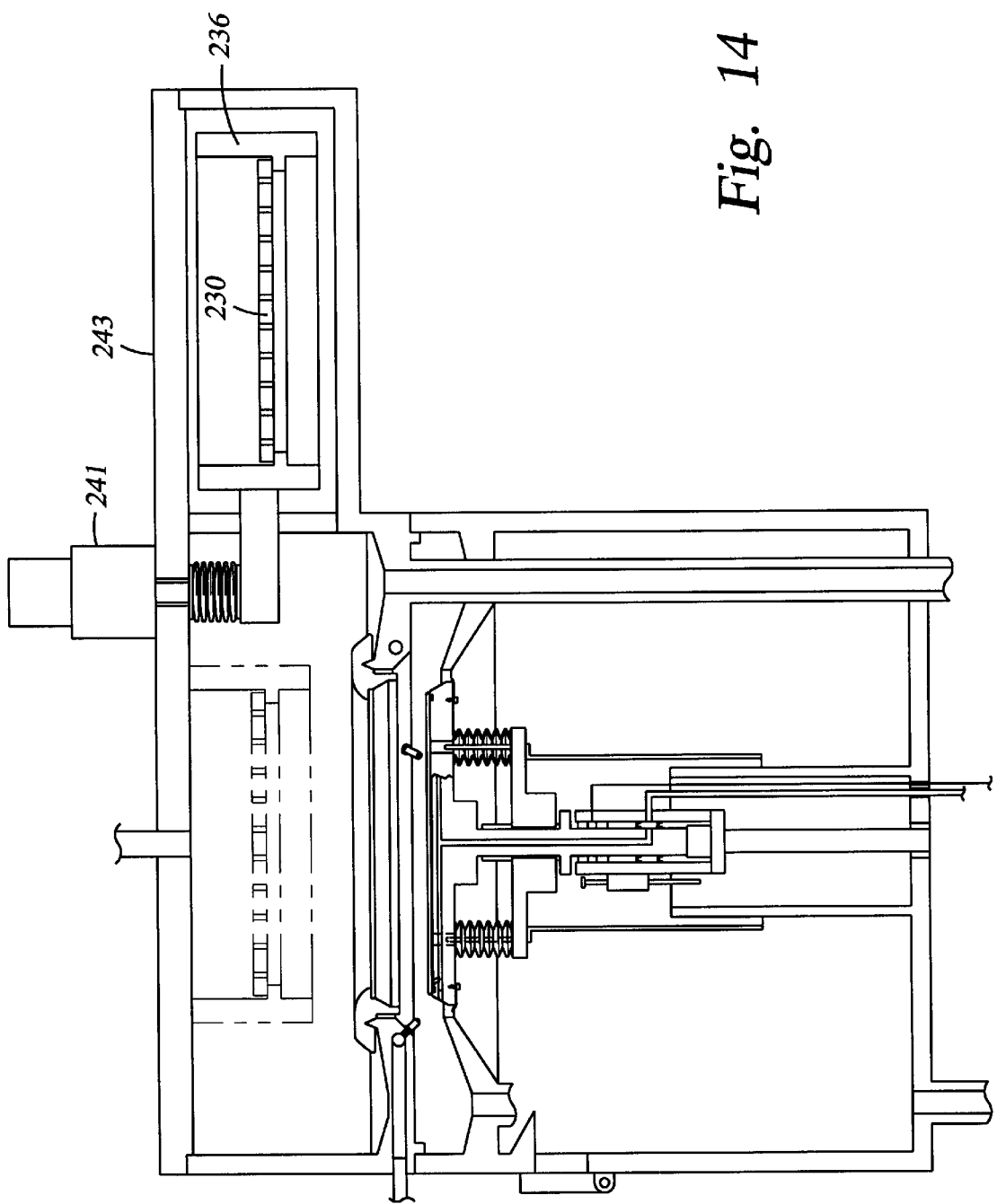
FIG. 14 is a side view of an electro-chemical deposition cell having a sub-chamber for the anode/cavity ring assembly.

FIG. 14 is a side view of an electro-chemical deposition cell having a sub-chamber for the anode/cavity ring assembly. The anode/cavity ring assembly is attached to a rotary assembly actuator 241 that moves the anode/cavity ring assembly into a sub-chamber 243 after the deposition phase of the process. By moving the anode plate 230 and the cavity ring 236 into the sub-chamber 243, the residual electroplating solution drips in the sub-chamber 243 and is prevented from contaminating the processed substrate deposition surface.

A layer of electroplating solution is typically left on the processed substrate deposition surface after the deposition phase of the process. To remove residual electroplating solution from the processed substrate deposition surface, a rinse agent is sprayed over the surface, and then the substrate is spun dry. Referring back to FIG. 3, a rinsing agent reservoir 96 supplies the rinse agent and is connected to a rinse agent manifold 261 through a rinse agent pump 97. One or more rinse spray spouts 260 are connected to the rinse agent manifold 261 to spray a rinse agent, such as deionized water or nitrogen gas, over the processed substrate deposition surface.

Referring now to FIG. 12, a substrate support member 204 is shown positioned in a rinsing position according to the invention. Preferably, one or more rinse spray spouts 260 are disposed on a bottom surface 262 of the inner terminus 250 of the electroplating solution catch cup 246. The rinse spray spouts 260 spray the rinse agent over the processed substrate deposition surface 214 after completion of the electro-chemical deposition process when the substrate support member 214 is lowered to a rinsing position. At the rinsing position, the substrate support member 204 is positioned below a horizontal plane defined by the rinse spray spouts 260 but above a horizontal plane defined by the tip of a rinse catch cup 264.

Figure 15:
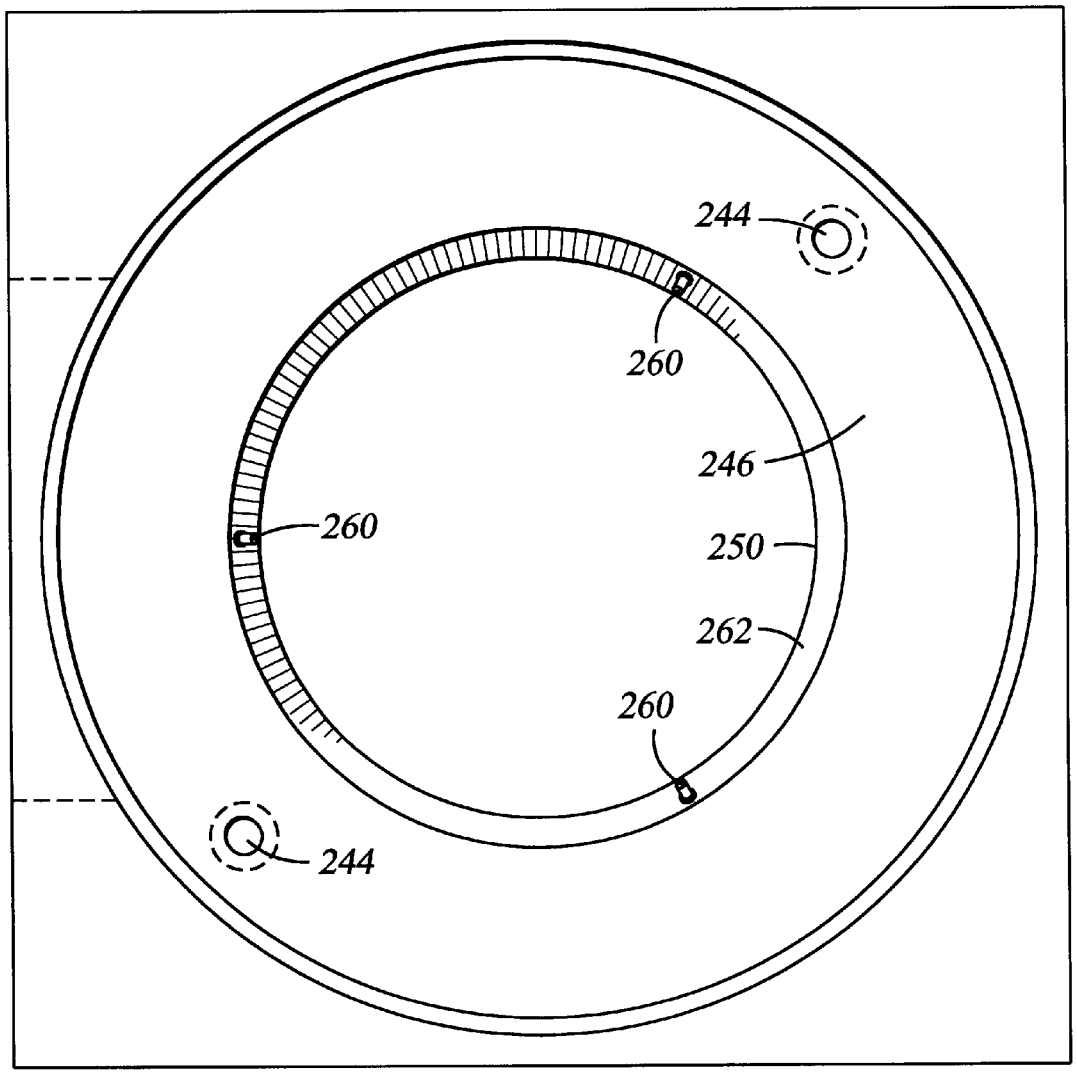
FIG. 15 is a bottom view of an electroplating solution catch cup 246 showing three rinse spouts 260 disposed on a bottom surface of the electroplating solution catch cup 246.

FIG. 15 is a bottom view of an electroplating solution catch cup 246 showing three rinse spouts 260 disposed on a bottom surface of the electroplating solution catch cup 246. Preferably, the rinse spouts 260 spray a mist of rinse agents over the processed substrate deposition surface 214. The rinse agent collect on the processed substrate deposition surface 214 to create a sheeting action of the rinse agent that removes the residual electroplating solution from the processed substrate deposition surface 214. The substrate support member 204 is then rotated to spin dry the substrate and remove the rinse agent from the processed substrate deposition surface 214.

Figure 16:
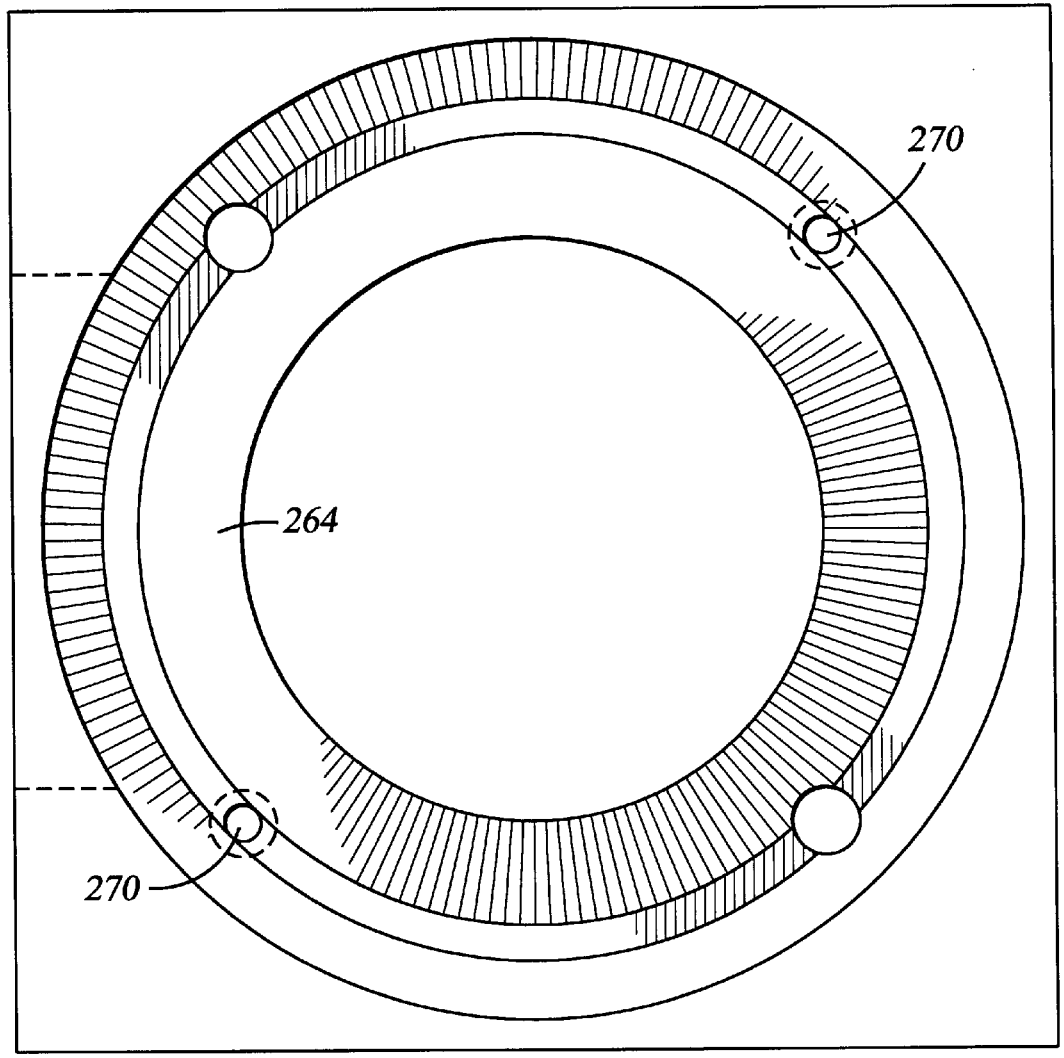
FIG. 16 is a top view of a rinse catch cup 264.

FIG. 16 is a top view of a rinse catch cup 264. Referring to both FIG. 12 and FIG. 16, a rinse catch cup 264 is disposed below the electroplating solution catch cup 246 and extends inwardly from the enclosure side wall 104 of the electro-chemical deposition cell 200 to direct overflowing rinse agents and any residual electroplating solution to a rinse drain 270. The inner terminus 266 of the rinse catch cup 264 defines an opening which outlines the circumference of the substrate support member 204 and allows the passage of the substrate support member 204 therethrough. The rinse catch cup 264 includes a downwardly sloping top surface 268 from the inner terminus 266 to a rinse drain 270. The rinse spray spout 260 sprays the rinse agent over the processed substrate deposition surface 214 to clean the deposited surface and to remove any excess electroplating solution remaining on the substrate deposition surface 214. As the substrate is spun dry, the rinse agent flows over the deposited substrate surface into the rinse catch cup 264 to the rinse drain 270 that drains the rinse agent to a bottom portion of the cell 200. The lower portion of the electro-chemical deposition cell 200 serves as a catch bowl, and an outlet 259 on the enclosure bottom 106 returns the used rinse solution to a purifier 98 and then back to the rinse solution reservoir 96 to be re-used for subsequent rinses (shown in FIG. 3). The rinse agent is then pumped out of the electro-chemical deposition cell 200 through an outlet 259 into a rinse agent reservoir 96.

In operation, a substrate 202 is transferred into the electro-chemical deposition cell 200 by a robot blade 88 through the slit opening 280 over a substrate support member 204 that is retracted fully. FIG. 3 is a cross sectional schematic view of an electro-chemical deposition cell 200 showing a robot blade transferring a substrate 202 into the electro-chemical deposition cell 200. A slit valve 282 is opened during the substrate transfer, and a robot blade 88 having a substrate 202 thereon enters the electro-chemical deposition cell 200 through the slit opening 280. The substrate 202 is positioned above the substrate support member 204, and the lift pin platform is elevated. The substrate 202 is lift above the robot blade 88 by the lift pins 272 on the lift pin platform 320 that is elevated by the lift platform actuator 326 extending the push rod 327. The robot blade 88 then retracts out of the electro-chemical deposition cell 200 and the slit valve 282 closes to seal the processing environment. FIG. 3 is a cross sectional schematic view of the electro-chemical deposition cell 200 showing a substrate positioned over a substrate support member 204 and supported by lift pins 272. The lift platform actuator 326 retracts the push rod 327 to lower the lift pin platform 320 and position the substrate 202 onto the substrate supporting surface 206 and the outer seal O-ring 298. The vacuum chuck 290 engages the vacuum suction to hold the substrate 202 on the substrate supporting surface 206, and the outer seal (O-ring) 298 seals the backside of the substrate 202 from the processing chemicals.

The actuator 346 then elevates the support member 204 to the processing position. FIG. 4 is a cross sectional schematic view of an electro-chemical deposition cell 200 having a substrate 202 disposed on a substrate support member 204 in a processing position according to the invention. At the processing position, the substrate 202 engages the cathode clamp ring 210, and an electrical power is delivered through the contact portion 208 of the cathode clamp ring 210 to the substrate deposition surface 214. An electroplating solution is pumped through the solution inlet 240 at the enclosure top 102 into the cavity ring 236 above the anode plate 230. The electroplating solution passes through the anode plate 230 onto the substrate deposition surface 214 to deposit a metal layer thereon.

During the deposition process, the rotary actuator 310 rotates the substrate support member 204 about a central axis through the rotating shaft 306 at between about 10 revolutions per minute (RPM) to about 50 RPM, and the actuator 346 provides a vibrational agitation to the substrate support member 204. The rotation and the agitation of the substrate support member 204 provide a uniform exposure of the electroplating solution to the substrate deposition surface 214 and promote uniform deposition thereon. Deposition uniformity is also improved by the continuous cathode contact provided by the cathode clamp ring 210 that distributes a uniform current density across the substrate deposition surface 214.

To enhance filling of high aspect ratio features on the substrate deposition surface, a plate/de-plate scheme is applied during the deposition phase of the process. The plate/deplate scheme generally comprises periodic reversal of the electrical current flowing through the electroplating solution between the cathode and the anode. During the plating period, the cathode and the anode are biased normally to cause electro-chemical deposition onto the cathode. During the de-plating period, the cathode and the anode are reverse biased and the electrical current is reversed to cause de-plating of the deposited surface. However, because a higher electrical current is applied for a shorter duration during the de-plating period, as compared to the plating period, the de-plating period removes the crowning or bridging effect at the mouth of the aperture of high aspect ratio features and enhances filling of the feature for the subsequent plating period.

After the electroplating solution flows over the substrate deposition surface 214, the electroplating solution flows over the cathode clamp ring 210 into the electrolyte catch cup 246. The electroplating solution then flows through the electrolyte drain 244 and is pumped out of the electro-chemical deposition cell 200 through outlet 258. Preferably, the electroplating solution is re-circulated through the electro-chemical deposition cell 200 until the end of the deposition process. Then, the electroplating solution is evacuated from the electro-chemical deposition cell 200 into the electrolyte reservoir 94 until the next deposition process.

Preferably, as the electroplating solution is evacuated, the rotational actuator 310 rotates the substrate support member 204 at a speed sufficient to spin dry the substrate deposition surface 214 by centrifugal force. The substrate support member 204 preferably spins at least about 100 RPM to spin dry the substrate 202.

After the deposition process, the actuator 346 lowers the substrate support member 204 to a rinsing position. The substrate 202 is preferably positioned below a horizontal plane defined by the rinse spray spouts 260 but above a horizontal plane defined by the tip of the rinse catch cup 264. The rinse spray spouts 260 spray the rinse agent over the processed substrate deposition surface 214 to clean the deposited surface and to remove any excess electroplating solution remaining on the substrate deposition surface 214. To end the rinse process, the substrate support member 204 rotates at a speed at least about 100 RPM to spin dry the substrate deposition surface 214 through centrifugal force. The rinse agent is drained through the rinse drain 270 to the bottom of the cell 200 and pumped out of the cell 200 through outlet 259 into a rinse agent reservoir 96.

After the rinse process, the actuator 346 retracts fully and lowers the substrate support member 204 to the transfer position as shown in FIG. 3. The vacuum chuck 290 disengages the vacuum suction and releases the substrate 202, and the lift platform actuator 326 extends the push rod 327 to elevate the lift pin platform 320 and the lift pins 272 to lift the processed substrate 202 above the substrate support surface 206. As the lift pins 272 lift the substrate 202 above the substrate support surface 206, a blow-off gas is pumped through the vacuum chuck 290 out of the vacuum port 294 to provide a gas flow directed at the backside edge of the substrate 202. The blow-off gas prevents any remaining rinse agent from contaminating the backside 215 of the substrate 202. The slit valve 282 opens, and the robot blade 88 extends into the electro-chemical deposition cell 200 through the slit 280. The robot blade 88 is positioned under the elevated substrate 202, and the lift pins 272 are lowered to position the substrate 202 onto the robot blade 88. The robot blade 88 then retracts out of the electro-chemical deposition cell 200 with the process substrate, and the process repeats for the next unprocessed substrate.

While the forgoing is directed to the preferred embodiment of the present invention, other and further embodiments of the invention may be devised without departing from the basic scope thereof. The scope of the invention is determined by the claims which follow.

What is claimed is:

1. An apparatus for electroplating a met al onto a substrate having a substrate plating surface, comprising:

a rotatable substrate support member having means for holding and rotating the substrate with the substrate plating surface facing upward during an electroplating process;

a cathode clamp ring disposed in electrical contact with the substrate plating surface;

an anode disposed above the substrate support member, an electroplating solution inlet supplying an electroplating solution fluidly connecting the anode and the substrate plating surface;

a power source connected to the anode and the cathode clamp ring, wherein an electrical contact to the cathode clamp ring is isolated from a region between the substrate support member and the anode, a cavity ring disposed below the electroplating solution inlet, the cavity ring and the anode defining a cavity for holding the electroplating solution; and an actuator connected to the cavity ring to move the cavity ring about a substantially horizontal plane.

2. The apparatus of claim 1 wherein the substrate support member comprises a vacuum chuck.

3. The apparatus of claim 2 wherein the substrate support member includes an annular seal on a substrate receiving surface for receiving the substrate.

4. The apparatus of claim 1 wherein the substrate support member is a rotatable member adapted to rotate between about 10 rpm and about 50 rpm during the electroplating process.

5. The apparatus of claim 1 wherein the substrate support member is a vibrational member.

6. The apparatus of claim 1 wherein the substrate support member includes a gas outlet disposed adjacent a peripheral portion of the substrate supporting surface.

7. The apparatus of claim 1 wherein the cathode clamp ting, comprises a conductive annular clamp ring.

8. The apparatus of claim 1 wherein the cathode clamp ring is fixedly connected to a cathode power supply.

9. The apparatus of claim 1 wherein the substrate support member includes a cathode contact disposed in selective engagement with the cathode.

10. The apparatus of claim 1 wherein the anode comprises a perforated plate.

11. The apparatus of claim 1 wherein the anode comprises a consumable metal source disposed in a liquid permeable enclosure.

12. The apparatus of claim 1 wherein the anode is a non-consumable anode.

13. The apparatus of claim 1, further comprising:
a shutter plate disposed between the anode and the substrate surface; and
an actuator connected to the shutter plate to move the shutter plate about a substantially horizontal plane.

14. The apparatus of claim 1, further comprising:
a rinse spray spout disposed above the substrate plating surface to spray a rinse agent over the substrate surface.

15. A method for electroplating a metal onto a substrate plating surface, comprising:
a) holding a substrate with the substrate plating surface face-up on a rotatable substrate support member having means for holding and rotating the substrate during an electroplating process;
b) electrically contacting a cathode clamp ring to the substrate plating surface;
c) positioning an anode above the substrate plating surface;
d) flowing an electroplating solution from the anode to the substrate plating surface;
e) supplying the electroplating solution into a cavity ring disposed above the anode; and
f) moving a shutter plate disposed between the anode and the substrate plating surface.

16. An apparatus for electroplating a metal onto a substrate having a substrate plating surface, comprising:
a) a rotatable substrate support member having means for holding and rotating the substrate with the substrate plating surface facing upward during an electroplating process;
b) a cathode clamp ring disposed in electrical contact with the substrate plating surface;
c) an anode disposed above the substrate support member;
d) an electroplating solution inlet supplying an electroplating solution fluidly connecting the anode and the substrate plating surface;
e) a cavity ring disposed below the electroplating solution inlet, the cavity ring and the anode defining a cavity for holding the electroplating solution; and
f) an actuator connected to the cavity ring to move the cavity ring about a substantially horizontal plane.

17. An apparatus for electroplating a metal onto a substrate having a substrate plating surface, comprising:
a) a rotatable substrate support member having means for holding and rotating the substrate with the substrate plating surface facing upward during an electroplating process;
b) a cathode clamp ring disposed in electrical contact with the substrate plating surface;
c) an anode disposed above the substrate support member;
d) an electroplating solution inlet supplying an electroplating solution fluidly connecting the anode and the substrate plating surface;
e) a shutter plate disposed between the anode and the substrate surface; and
f) an actuator connected to the shutter plate to move the shutter plate about a substantially horizontal plane.

18. A method for electroplating a metal onto a substrate plating surface, comprising:
a) holding a substrate on a rotatable support member in a generally face-up orientation;
b) electrically contacting a cathode clamp ring to the plating surface;
c) positioning an anode above the plating surface;
d) flowing an electroplating solution from the anode to the plating surface;
e) supplying the electroplating solution into a cavity ring disposed above the anode; and
f) moving a shutter plate disposed between the anode and the plating surface.

19. An apparatus for electroplating a metal onto a substratate, comprising;
a) a rotatable support member having a receiving surface for supporting the substrate, in a generally face-up orientation;
b) a cathode clamp ring disposable in electrical contact with a plating surface of the substrate;
c) an anode disposed above the substrate support member,
d) a cavity ring disposed below the electroplating solution inlet, the cavity ring and the anode defining a cavity for holding the electroplating solution; and
e) an actuator connected to the cavity ring to move the cavity ring about a substantially horizontal plane.

20. An apparatus for electroplating a metal onto a substrate plating surface disposed in a generally face-up orientation, comprising:
a) a rotatable support member,
b) a cathode clamp ring disposed in electrical contact with the plating surface;
c) an anode disposed above the substrate support member:
d) an electroplating solution inlet connectable to an electroplating solution supply;
e) a shutter plate disposed between the anode and the plating surface; and
f) an actuator connected to the shutter plate to move the shutter plate about a substantially horizontal plane.

21. An apparatus for electroplating a metal onto a substrate comprising:
a) an enclosure;

b) a rotatable support member for supporting the substrate in a face-up processing position, wherein the face comprises a plating surface;

c) a cathode clamp ring adapted to electrically contact the plating surface, wherein the cathode clamp ring comprises one or more locking grooves disposed on a bottom surface thereof, and d) an anode disposed above the substrate support member, wherein an electrical contact to the cathode clamp ring is isolated from the electroplating solution, and wherein the cathode clamp ring is electrically connected to a power source through one or more cathode contacts disposed about the support member.

22. The method of claim 21, wherein the cathode clamp ring comprises a contact portion directly in contact with a peripheral portion of the plating surface.

23. The apparatus of claim 22, wherein the cathode clamp ring is rotatable with the substrate support due to a frictional force between the contact portion of the clamp ring and the plating surface of the substrate.

24. An apparatus for electroplating a metal onto a substrate having a substrate plating surface, comprising:

a) a rotatable substrate support member having means for holding and rotating the substrate with the substrate plating surface facing upward during an electroplating process;

b) a cathode clamp ring disposed in electrical contact with the substrate plating surface;

c) an anode disposed above the substrate support member;

d) an electroplating solution inlet supplying an electroplating solution fluidly connecting the anode and the substrate plating surface;

e) a power source connected to the anode and the cathode clamp ring, wherein an electrical contact to the cathode clamp ring is isolated from a region between the substrate support member and the anode;

f) a shutter plate disposed between the anode and the substrate surface; and g) an actuator connected to the shutter plate to move the shutter plate about a substantially horizontal plane.

25. An apparatus for electroplating a metal onto a substrate comprising:

a) an enclosure;

b) a rotatable support member for supporting the substrate in a face-up processing position, wherein the face comprises a plating surface;

c) a cathode clamp ring adapted to electrically contact the plating surface, wherein the cathode clamp ring comprises one to more looking grooves disposed on a bottom surface thereof; and d) an anode disposed above the substrate support member, wherein an electrical contact to the cathode clamp ring is isolated from the electroplating solution, and e) one or more cathode contacts disposed about the support member and disposable within the locking grooves thereby allowing the cathode clamp ring to rotate with the support member.

* * * * *

UNITED STATES PATENT AND TRADEMARK OFFICE
CERTIFICATE OF CORRECTION

PATENT NO. : 6,416,647 B1
DATED : July 9, 2002
INVENTOR(S) : Dordi et al.

It is certified that error appears in the above-identified patent and that said Letters Patent is hereby corrected as shown below:

Column 11,
Line 17, please change "angle a" to -- angle α --.

Column 16,
Line 48, please change "met al" to -- metal --.

Column 17,
Line 18, please change "ting" to -- ring --.

Signed and Sealed this

Tenth Day of June, 2003

JAMES E. ROGAN
*Director of the United States Patent and Trademark Office*